US012660517B2

(12) United States Patent
Lee et al.

(10) Patent No.: US 12,660,517 B2
(45) Date of Patent: Jun. 16, 2026

(54) MEMORY DEVICE AND ELECTRONIC SYSTEM INCLUDING THE SAME

(71) Applicant: Samsung Electronics Co., Ltd., Suwon-si (KR)

(72) Inventors: Jinwoo Lee, Suwon-si (KR); Hyunsang Hwang, Suwon-si (KR); Youngdong Kim, Suwon-si (KR); Dongho Ahn, Suwon-si (KR); Jin Myung Choi, Suwon-si (KR); Geon Hui Han, Suwon-si (KR)

(73) Assignees: SAMSUNG ELECTRONICS CO., LTD., Suwon-si (KR); POSTECH Research and Business Development Foundation, Suwon-si (KR)

( * ) Notice: Subject to any disclaimer, the term of this patent is extended or adjusted under 35 U.S.C. 154(b) by 91 days.

(21) Appl. No.: 18/818,913

(22) Filed: Aug. 29, 2024

(65) Prior Publication Data

US 2025/0081865 A1      Mar. 6, 2025

(30) Foreign Application Priority Data

Sep. 5, 2023     (KR) ........................ 10-2023-0117906

(51) Int. Cl.
      *H10N 70/00*          (2023.01)
      *H10B 63/00*          (2023.01)
                    (Continued)

(52) U.S. Cl.
      CPC ......... *H10N 70/8833* (2023.02); *H10B 63/30* (2023.02); *H10B 63/80* (2023.02);
                    (Continued)

(58) Field of Classification Search
      CPC .. H10N 70/8833; H10N 70/24; H10N 70/826; H10N 70/841; H10N 70/821;
                    (Continued)

(56) References Cited

U.S. PATENT DOCUMENTS 9,059,395 B2     6/2015  Ju et al.
9,859,338 B2     1/2018  Chen et al.
                    (Continued)

FOREIGN PATENT DOCUMENTS

JP            6758124 B2 *  9/2020
KR    10-2010-0020844 A     2/2010
                    (Continued)

*Primary Examiner* — Fernando Hidalgo
(74) *Attorney, Agent, or Firm* — Muir Patent Law, PLLC

(57)                ABSTRACT

A memory device comprising a stacking structure including a plurality of electrodes and an insulation layer between the plurality of electrodes. The stacking structure has a recess portion corresponding to the plurality of electrodes or the insulation layer at a side surface of the stacking structure. The memory device also comprising a resistance variable layer on the side surface of the stacking structure having the recess portion, and includes a portion extending in an extension direction crossing the stacking structure. The resistance variable layer includes a first portion including a first expanded portion along a recess surface of the recess portion, a second portion including a second expanded portion along the recess surface of the recess portion on the first portion, and a third portion on the second portion. The second portion has a resistance smaller than a resistance of the first portion.

20 Claims, 20 Drawing Sheets

(51) Int. Cl.
*H10N 70/20* (2023.01)
*G11C 13/00* (2006.01)

(52) U.S. Cl.
CPC ........... *H10N 70/24* (2023.02); *H10N 70/826*
(2023.02); *H10N 70/841* (2023.02); *G11C*
*13/0004* (2013.01); *G11C 13/0007* (2013.01);
*G11C 13/0069* (2013.01)

(58) Field of Classification Search
CPC ...... H10N 70/253; H10B 63/30; H10B 63/80;
H10B 63/34; H10B 63/84; G11C
13/0004; G11C 13/0007; G11C 13/0069
USPC ......................................................... 365/148
See application file for complete search history.

(56) References Cited

U.S. PATENT DOCUMENTS

| | | | |
|---|---|---|---|
| 10,529,921 B2 | 1/2020 | Chu et al. | |
| 11,322,685 B2 | 5/2022 | Pesic et al. | |
| 11,723,289 B2 | 8/2023 | Kim et al. | |
| 12,518,828 B2 * | 1/2026 | Yoshihara | G11C 16/0483 |
| 2014/0097397 A1 | 4/2014 | Park et al. | |
| 2021/0202833 A1 | 7/2021 | Kim et al. | |
| 2023/0337555 A1 | 10/2023 | Kim et al. | |
| 2024/0081063 A1 * | 3/2024 | Pesic | H10B 43/30 |
| 2025/0024685 A1 * | 1/2025 | Zhou | H10B 43/27 |

FOREIGN PATENT DOCUMENTS

| | | |
|---|---|---|
| KR | 10-1176543 B1 | 8/2012 |
| KR | 10-2021-0083933 A | 7/2021 |

* cited by examiner

MEMORY DEVICE AND ELECTRONIC SYSTEM INCLUDING THE SAME

CROSS-REFERENCE TO RELATED APPLICATION

This application claims priority under 35 U.S.C. § 119 to and the benefit of Korean Patent Application No. 10-2023-0117906 filed in the Korean Intellectual Property Office on Sep. 5, 2023, the entire content of which is incorporated herein by reference.

BACKGROUND

(a) Field

The present disclosure relates to a memory device and an electronic system including the same.

(b) Description of the Related Art

In an electron system implementing a data storage, a memory device may be capable of storing high-capacity data. Accordingly, a method for increasing a data storage capacity of a memory device is being researched. As one method for increasing the data storage capacity of a memory device, a memory device including three-dimensionally arranged memory cells instead of two-dimensionally arranged memory cells has been proposed.

SUMMARY

The present disclosure attempts to provide a memory device capable of enhancing performance and an electronic system including the same.

A memory device according to an embodiment includes a stacking structure and a resistance variable layer. The stacking structure includes a plurality of electrodes and an insulation layer between the plurality of electrodes. The stacking structure has a recess portion corresponding to the plurality of electrodes or the insulation layer at a side surface of the stacking structure. The resistance variable layer is on the side surface of the stacking structure having the recess portion, and includes a portion extending in an extension direction crossing the stacking structure.

The resistance variable layer includes a first portion including a first expanded portion along a recess surface of the recess portion, a second portion including a second expanded portion along the recess surface of the recess portion on the first portion, and a third portion on the second portion. The second portion has a resistance smaller than resistance of the first portion. The second portion may have the resistance smaller than a resistance of the third portion.

The resistance variable layer includes an expanded portion along a recess surface of the recess portion, and the expanded portion includes a plurality of portions having different materials, compositions, or resistances.

An electronic system according to an embodiment includes a main substrate, the memory cell on the main substrate, and a controller connected to the memory device on the main substrate.

According to an embodiment, a memory cell is configured as a resistive random access memory cell, thereby preventing or suppressing interference between neighboring memory cells. Accordingly, a thickness of gate electrodes may be reduced, thereby increasing a number of gate electrodes and increasing a memory capacity.

In this instance, a recess portion is provided at a side surface of a stacking structure, and a resistance variable layer including portions having different materials, compositions, or resistances at the side surface of the stacking structure having the recess portion, thereby minimizing a size of a memory switching region. Therefore, operating voltage may be reduced and an operating voltage distribution may be effectively reduced. Accordingly, performance of a memory device may be enhanced.

BRIEF DESCRIPTION OF THE DRAWINGS

FIG. 6 is a cross-sectional view schematically illustrating a semiconductor device according to an embodiment.

DETAILED DESCRIPTION

Figure 1:
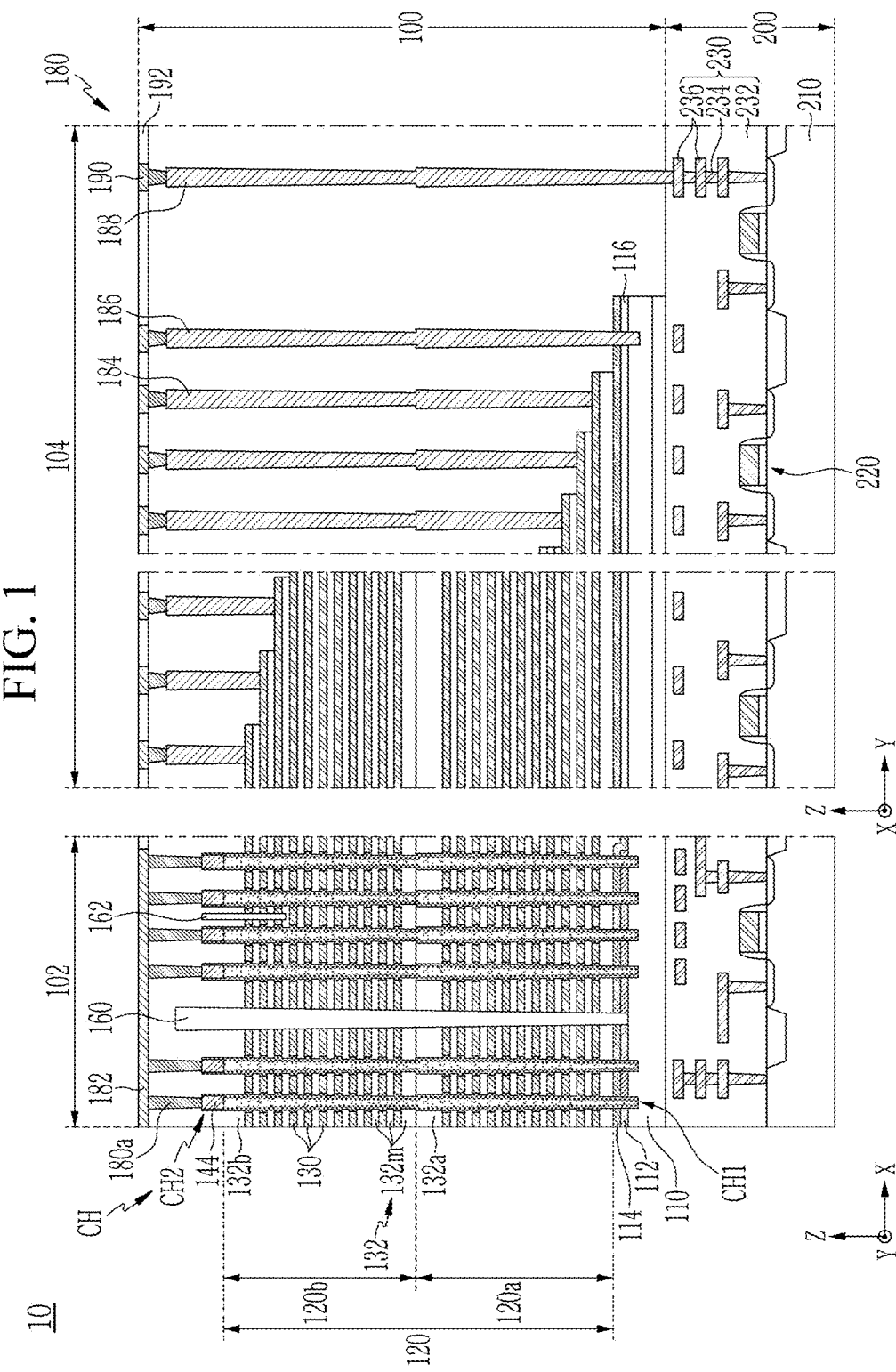
FIG. 1 is a cross-sectional view schematically illustrating a semiconductor device according to an embodiment.

Embodiments of the present disclosure will be described more fully hereinafter with reference to the accompanying drawings for those skilled in the art to which the present disclosure pertains to easily practice the present disclosure. The present disclosure may be implemented in various different forms and is not limited to the embodiment provided herein.

A portion unrelated to the description is omitted in order to clearly describe the present disclosure, and the same or similar components are denoted by the same reference numeral throughout the present specification.

Further, since sizes and thicknesses of portions, regions, members, units, layers, films, etc. illustrated in the accompanying drawings may be arbitrarily shown for better understanding and convenience of explanation, the present disclosure is not limited to the illustrated sizes and thicknesses.

In the drawings, thicknesses of portions, regions, members, units, layers, films, etc. may be enlarged or exaggerated for convenience of explanation.

It will be understood that when a component such as a layer, film, region, or substrate is referred to as being "on" another component, it may be directly on other component or an intervening component may also be present. In contrast, when a component is referred to as being "directly on" another component, there is no intervening component present. Further, when a component is referred to as being "on" or "above" a reference component, a component may be positioned on or below the reference component, and does not necessarily be "on" or "above" the reference component toward an opposite direction of gravity.

In addition, unless explicitly described to the contrary, the word "comprise", "include", or "contain", and variations such as "comprises", "comprising", "includes", "including", "contains" or "containing" will be understood to imply inclusion of other component rather than the exclusion of any other components.

Further, throughout the specification, a phrase "on a plane", "in a plane", "on a plan view", or "in a plan view" may indicate a case where a portion is viewed from above or a top portion, and a phrase "on a cross-section" or "in a cross-section" may indicate when a cross-section taken along a vertical direction is viewed from a side.

Hereinafter, with reference to FIG. 1 to FIG. 4, FIG. 5A to FIG. 5D, a memory device and a manufacturing method of the same according to an embodiment will be described in detail.

Figure 2:
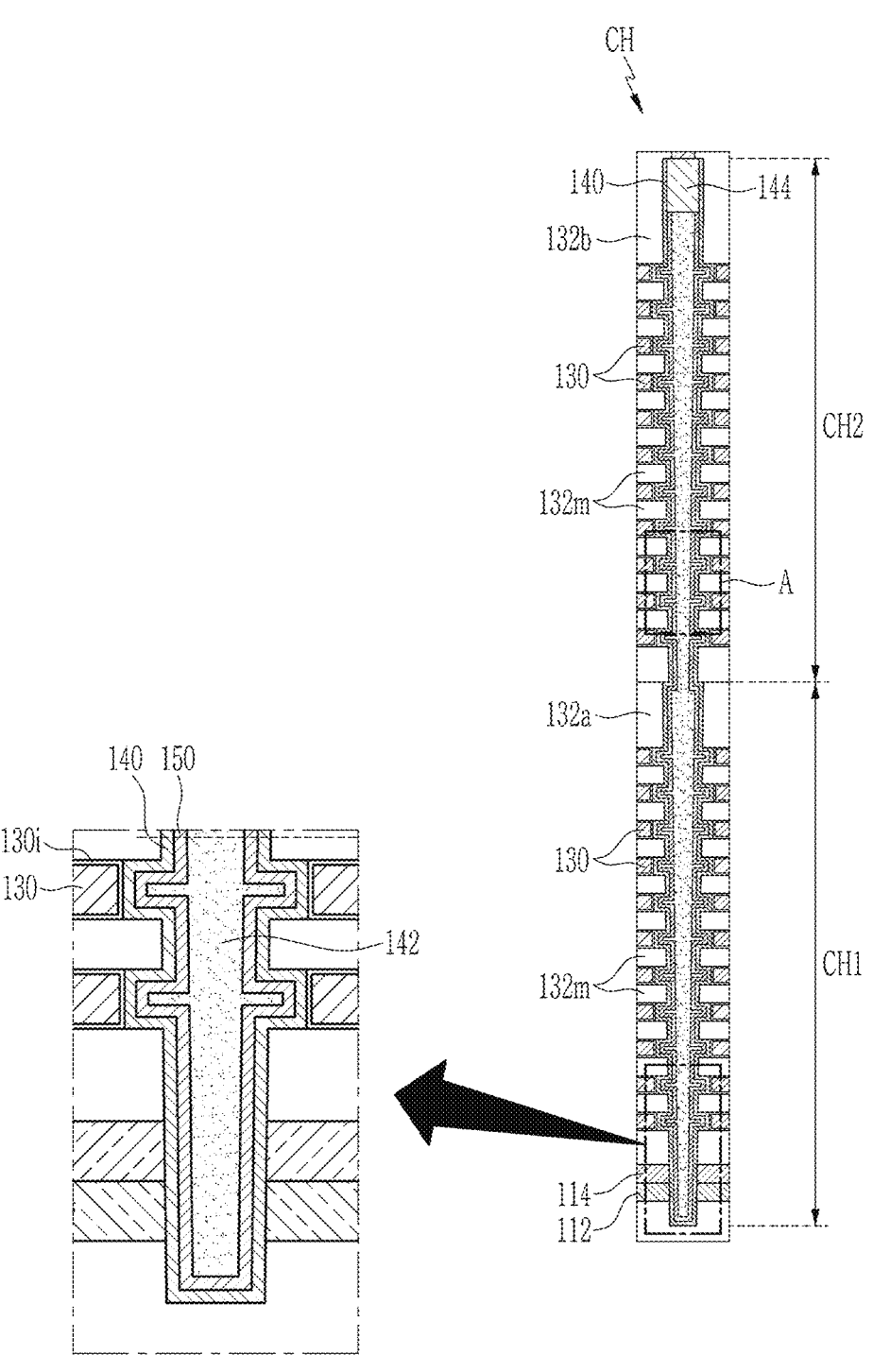
FIG. 2 is a partial cross-sectional view illustrating an example of a channel structure included in the semiconductor device illustrated in FIG. 1.

FIG. 1 is a cross-sectional view schematically illustrating a semiconductor device according to an embodiment. FIG. 2 is a partial cross-sectional view illustrating an example of a channel structure included in the semiconductor device illustrated in FIG. 1, and FIG. 3 is an enlarged partial cross-sectional view illustrating a portion A of FIG. 2.

Figure 3:
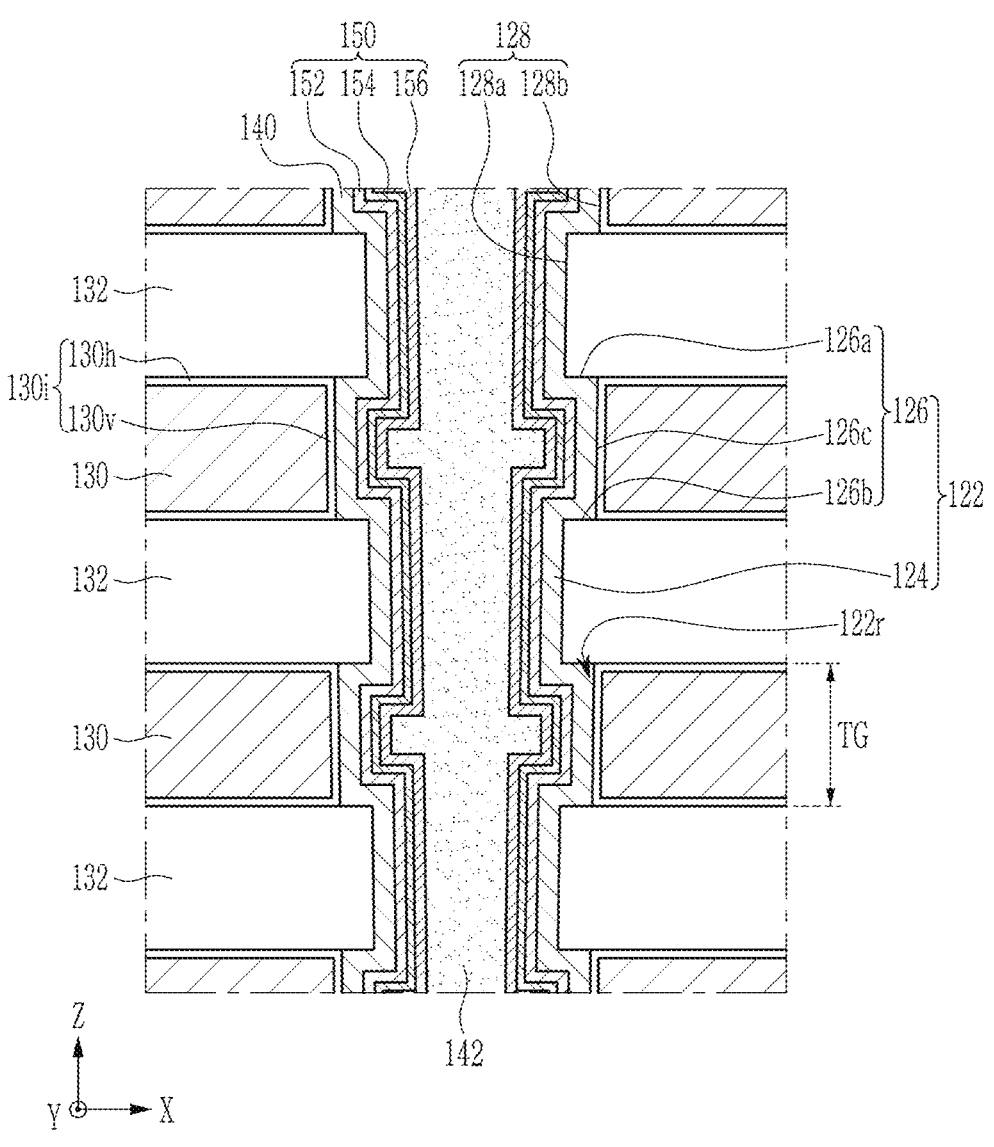
FIG. 3 is an enlarged partial cross-sectional view illustrating a portion A of FIG. 2.

Referring to FIG. 1 to FIG. 3, a semiconductor device 10 according to an embodiment may include a cell region 100 including a memory cell structure and a circuit region 200 including a peripheral circuit structure controlling an operation of the memory cell structure. In an embodiment, the semiconductor device 10 may be a memory device. For example, the circuit region 200 and the cell region 100 may correspond to a first structure 1100F and a second structure 1100S of a semiconductor device 1100 included in an electronic system 1000 illustrated in FIG. 12, respectively. In some embodiments, the circuit region 200 and the cell region 100 may be portions including a first structure 3100 and a second structure 3200 of a semiconductor chip 2200 illustrated in FIG. 14, respectively.

Here, the circuit region 200 may include the peripheral circuit structure on a first substrate 210, and the cell region 100 may include a gate stacking structure 120 and a channel structure CH on a cell array region 102 of a second substrate 110 as the memory cell structure. The circuit region 200 may include a first wiring portion 230 electrically connected to the peripheral circuit structure, and the cell region 100 may include a second wiring portion 180 electrically connected to the memory cell structure.

In an embodiment, the cell region 100 may be on the circuit region 200. Accordingly, an area corresponding to the circuit region 200 does not need to be secured separately from the cell region 100. Therefore, an area of the semiconductor device 10 may be reduced. However, the embodiments are not limited thereto, and the circuit region 200 may be disposed next to the cell region 100. Various other modifications are possible.

The circuit region 200 may include the first substrate 210, and a circuit element 220 and the first wiring portion 230 on the first substrate 210.

The first substrate 210 may be a semiconductor substrate including a semiconductor material. For example, the first substrate 210 may be a semiconductor substrate including or formed of a semiconductor material or may be a semiconductor substrate in which a semiconductor layer is formed on a base substrate. For example, the first substrate 210 may include or be formed of single-crystalline or polycrystalline silicon, epitaxial silicon, germanium, silicon-germanium, silicon on insulator (SOI), germanium on insulator (GOI), or the like.

The circuit element 220 on the first substrate 210 may include any of various circuit elements that control the operation of the memory cell structure in the cell region 100. For example, the circuit element 220 may constitute the peripheral circuit structure such as a decoder circuit 1110 (refer to FIG. 12), a page buffer 1120 (refer to FIG. 12), a logic circuit 1130 (refer to FIG. 12), or the like. For example, the circuit element 220 may include a transistor, but the embodiments are not limited thereto. For example, the circuit element 220 may include not only an active element such as the transistor or the like but also a passive element such as a capacitor, a resistor, an inductor, or the like.

The first wiring portion 230 on the first substrate 210 may be electrically connected to the circuit element 220. In an embodiment, the first wiring portion 230 may include a plurality of wiring layers 236 that are spaced apart from each other while interposing a first insulation layer 232 therebetween and are electrically connected by a contact via 234 to form a desired path. The wiring layer 236 or the contact via 234 may include any of various conductive materials, and the first insulation layer 232 may include any of various insulating materials.

The cell region 100 may include a cell array region 102 and a connection region 104. The gate stacking structure 120 and the channel structure CH may be on the second substrate 110 in the cell array region 102. A structure that connects the gate stacking structure 120 and/or the channel structure CH in the cell array region 102 to the circuit region 200 or an external circuit may be in the connection region 104.

In an embodiment, the second substrate 110 may include a semiconductor layer including a semiconductor material. For example, the second substrate 110 may be a semiconductor substrate including or formed of a semiconductor material or may be a semiconductor substrate in which a semiconductor layer is formed on a base substrate. For example, the second substrate 110 may include or be formed of silicon, germanium, silicon-germanium, silicon on insulator, germanium on insulator, or the like. Here, the semiconductor material included in the second substrate 110 may be doped with a p-type dopant or an n-type dopant. For example, the n-type dopant (e.g., phosphorus (P), arsenic (As), or the like) may be doped. However, the embodiments are not limited to a conductive type, a material, or the like of the dopant doped to the semiconductor material.

In the cell array region 102, the gate stacking structure 120 and the channel structure CH may be positioned. The gate stacking structure 120 may include cell insulation layers 132 and gate electrodes 130 alternately stacked on a first surface (e.g., a front surface or an upper surface) of the second substrate 110. The channel structure CH may include a portion extending in an extension direction (a Z-axis direction in the drawings) while penetrating the gate stacking structure 120. Here, the extension direction may be a direction crossing (e.g., perpendicular to) the gate stacking structure 120 or a direction crossing (e.g., perpendicular to) the second substrate 110. In an embodiment, horizontal conductive layers 112 and 114 may be provided between the second substrate 110 and the gate stacking structure 120 in the cell array region 102. The horizontal conductive layers 112 and 114 may electrically connect the channel structure CH and the second substrate 110. For example, the horizontal conductive layers 112 and 114 may include a first horizontal conductive layer 112 on one surface of the second substrate 110, and may further include a second horizontal conductive layer 114 on the first horizontal conductive layer 112. In a region of connection region 104, the first horizontal conductive layer 112 may be not provided and a horizontal insulation layer 116 may be provided between the second substrate 110 and the gate stacking structure 120. In a manufacturing process, a part of the horizontal insulation layer 116 may be replaced with the first horizontal conductive layer 112, and another part of the horizontal insulation layer 116 positioned in connection region 104 may remain in the connection region 104.

The first horizontal conductive layer 112 may act as a part of a common source line of the semiconductor device 10. For example, the first horizontal conductive layer 112 may act as the common source line together with the second substrate 110. As illustrated in an enlarged portion of FIG. 2, the channel structure CH may extend to reach the second substrate 110 while penetrating the horizontal conductive layers 112 and 114, and the first horizontal conductive layer 112 is directly connected to a channel layer 140 at a portion where the first horizontal conductive layer 112 is positioned.

In FIG. 2, it is illustrated as an example that a gate insulation layer 130i is at a portion where the gate electrode 130 is positioned and is not positioned at a side of the channel structure CH in a penetration region 128. In some embodiments, the gate insulation layer 130i may be formed in the penetration region 128 before the channel structure CH is formed. In this instance, a portion of the gate insulation layer 130i may be removed at a portion where the first horizontal conductive layer 112 is positioned, and the first horizontal conductive layer 112 is directly connected to the channel layer 140 at a circumference of the channel layer 140.

The first and the second horizontal conductive layers 112 and 114 may include a semiconductor material (e.g., polycrystalline silicon). For example, the first horizontal conductive layer 112 may include a polycrystalline silicon layer doped with a dopant, and the second horizontal conductive layer 114 may include a polycrystalline silicon layer doped with a dopant or a layer including a dopant diffused from the first horizontal conductive layer 112. However, the embodiments are not limited thereto. The second horizontal conductive layer 114 may include an insulating material. In some embodiments, the second horizontal conductive layer 114 might not be provided.

The gate stacking structure 120 in which a plurality of cell insulation layers 132 and a plurality of gate electrodes 130 are alternately stacked may be on the second substrate 110 (e.g., on the first and second horizontal conductive layers 112 and 114 on the second substrate 110).

The cell insulation layers 132 may include interlayer insulation layers 132m each positioned under the gate electrode 130 or between two adjacent gate electrodes 130 in the gate stacking structure 120, and upper insulation layers 132a and 132b at upper portions of the respective gate stacking structures 120. In the embodiment, the plurality of cell insulation layers 132 may not all have the same thickness. For example, the upper insulation layers 132a and 132b may have a greater thickness than the interlayer insulation layers 132m. For simplicity of illustration, it is illustrated in the drawings that one cell insulation layer 132 is provided without a boundary in the connection area 104. However, the cell insulation layer 132 in the connection area 104 may have any of various structures including either one insulation layer or a plurality of insulation layers, and the embodiments are not limited thereto. In this manner, a shape, a structure, or the like of the cell insulation layer 132 may be modified in various manners in certain embodiments.

In an embodiment, as illustrated in the enlarged view of FIG. 2 or in FIG. 3, the gate insulation layer 130i including or formed of an insulating material may be disposed at an outer side of the gate electrode 130. For example, the gate insulation layer 130i may include horizontal portions 130h extending horizontally on upper and lower surfaces of the gate electrode 130, and an extension portion 130v extending in the extension direction on a side surface of the gate electrode 130 adjacent to the channel structure CH. More particularly, the horizontal portion 130h may be between the gate electrode 130 and the cell insulation layer 132. The extension portion 130v may be a portion between the side surface of the gate electrode 130 and the channel layer 140 of the channel structure CH to substantially serve as a gate insulation layer. In this instance, the gate electrode 130 and the gate insulation layer 130i may be referred to as a gate structure.

In the embodiment, a plurality of gate structures including a plurality of gate electrodes 130 and the plurality of cell insulation layers 132 may be alternately stacked to constitute the gate stacking structure 120. In an embodiment, a thickness TG of the gate structure may refer to a sum of thicknesses of the gate electrode 130 and the gate insulation layers 130i on the upper and lower surfaces of the gate electrode 130. In the present disclosure, a thickness may refer to a thickness in the extension direction of the channel structure CH (a Z-axis direction in the drawing).

Accordingly, the horizontal portion 130h of the gate insulation layer 130i might not be at a side where a recess portion 122r corresponding to the gate electrode 130 is positioned. As a result, the recess portion 122r in which a channel layer 140 and a resistance variable layer 150 are positioned may have a sufficient space, such that the channel layer 140 and the resistance variable layer 150 may be stably positioned in the recess portion 122r. The gate insulation layer 130i may be formed in a space for forming the gate electrode 130 before the gate electrode 130 is formed to form the gate insulation layer 130i having the above structure.

However, the embodiments are not limited thereto, and the gate insulation layer 130i may be formed in the penetration region 128 before the channel layer 140 is formed. In this case, the horizontal portions 130h of the gate insulation layer 130i may be provided on lower and upper surfaces of two cell insulation layers 132 constituting the recess portion 130r, respectively, and the extension portion 130v may be positioned therebetween. That is, the gate insulation layers 130i may be formed continuously and entirely between a side surface of the gate stacking structure 120 and the channel layer 140. In this case, a gate structure may be constituted by the gate electrode 130, and the thickness TG of the gate structure may be a thickness of the gate electrode 130. Other numerous modifications are possible.

The gate electrode 130 may include any of various conductive materials. For example, the gate electrode 130 may include a metal (e.g., tungsten (W), copper (Cu), aluminum (Al), or the like), polycrystalline silicon, or metal nitride (e.g., titanium nitride (TiN), tantalum nitride (TaN), or the like), or a combination thereof. The cell insulation layer 132 may include any of various insulating materials. For example, the cell insulation layer 132 may include silicon oxide, silicon nitride, silicon oxynitride, a low dielectric constant material having a lower dielectric constant than silicon oxide, or a combination thereof. The gate insulation layer 130*i* may include an insulating material such as silicon oxide, silicon oxynitride, or aluminum oxide. Materials of the gate electrode 130, the gate insulation layer 130*i*, and the cell insulation layer 132 may be modified in various manners, and the embodiments are not limited to what has been described above.

In an embodiment, the penetration region 128 may penetrate the gate stacking structure 120, and the channel structure CH may be in the penetration region 128. The penetration region 128 may include a penetration portion 128*a* and a protrusion portion 128*b*.

In an embodiment, the penetration portion 128*a* may penetrate the gate stacking structure 120 and extend in the extension direction (a Z-axis direction in the drawing). A plurality of protrusion portions 128*b* may protrude in a horizontal direction from the penetration portion 128*a* to correspond to the plurality of electrodes or insulation layers, respectively. As a result, a plurality of recess portions 122*r* may be provided to correspond to the plurality of electrodes or insulation layers, respectively, at the side surface of the gate stacking structure 120 adjacent to the channel structure CH. This will be explained in more detail later.

Each of the channel structures CH constitutes one memory cell string, and the plurality of channel structures CH may be spaced apart from each other while forming rows and columns in a plan view. For example, the plurality of channel structures CH may be arranged in any of various forms such as a lattice form and a zigzag form in a plan view. The channel structure CH may have a pillar shape. As an example, when viewed in a cross-sectional view, the channel structure CH may have an inclined side surface such that a width of the channel structure CH decreases as the channel structure CH goes to the second substrate 110 (e.g., extends in the Z-axis direction) according to an aspect ratio. However, the embodiments are not limited thereto, and an arrangement, a structure, a shape, or the like of the channel structures CH may be modified in various manners.

The channel structure CH may include a channel layer 140 and a resistance variable layer 150 sequentially stacked on the side surface 122 of the gate stacking structure 120. The channel structure CH may further include a core insulation layer 142 at an inside (e.g., a central region) of the channel layer 140 and the resistance variable layer 150. The channel structure CH may further include a channel pad 144 connected to the channel layer 140 at an upper portion of the channel structure CH. In some embodiments, the gate insulation layer 130*i* may be in the penetration region 128 to be included in the channel structure CH.

In an embodiment, the channel layer 140 may include any of various semiconductor materials. For example, the channel layer 140 may include at least one of a single semiconductor material, an oxide semiconductor material, and a two-dimensional semiconductor material. In a case where the channel layer 140 is formed of the single semiconductor material, the channel layer 140 may be formed through an easier process (e.g., less process steps). In a case where the channel layer 140 is formed of the oxide semiconductor material, the two-dimensional semiconductor material, or the like, operating voltage of the memory cell may be reduced with low resistance. For example, the single semiconductor material may be polycrystalline silicon or the like. The oxide semiconductor material may include indium gallium zinc oxide (IGZO), indium gallium silicon oxide (IGSO), indium tin zinc oxide (ITZO), indium gallium tin oxide (IGTO), indium zinc oxide (IZO), zinc oxide (ZnO), zinc tin oxide (ZTO), zinc oxynitride (ZnON), zirconium zinc tin oxide (ZZTO), tin oxide (SnO), hafnium indium zinc oxide (HIZO), gallium zinc tin oxide (GZTO), aluminium zinc tin oxide (AZTO), ytterbium gallium zinc oxide (YGZO), indium gallium oxide (InxGayO or IGO), or a combination thereof. The two-dimensional semiconductor material may include graphene, tungsten selenide (WSe$_2$), or the like. However, the embodiments are not limited thereto, and a material of the channel layer 140 may be modified in various manners.

The resistance variable layer 150 may include oxide of which an internal resistance changes depending on a direction and/or an intensity of an electric field applied to the resistance variable layer 150 or voltage applied to the resistance variable layer 150. In an embodiment, the resistance variable layer 150 may be disposed along the side surface 122 of the gate stacking structure 120 having the recess portion 122*r*, and may include a plurality of portions having different materials, compositions, or resistances (e.g., "electrical resistances," "electrical resistance values," or "resistance values"). This will be described in detail later with reference to FIG. 4 together with FIG. 3.

The core insulation layer 142 may include any of various insulating materials. For example, the core insulation layer 142 may include silicon oxide, silicon nitride, silicon oxynitride, or a combination thereof. However, the embodiments are not limited to a material of the core insulation layer 142, and the core insulation layer 142 might not be provided.

The channel pad 144 connected to the channel layer 140 may be at an upper portion of the channel structure CH. For example, the channel pad 144 may be connected to the channel layer 140 at an upper portion of the core insulation layer 142. The resistance variable layer 150 may be removed at a portion where the channel pad 144 may be positioned, and a side surface of the channel layer 140 may be directly connected to a side surface of the channel pad 144. Since the resistance variable layer 150 may be formed of oxide and thus may have a relatively high resistance, the resistance variable layer 150 may be removed so that the channel layer 140 and the channel pad 144 are in contact with each other in a face-to-face structure to improve electrical properties. The channel pad 144 may include a conductive material, e.g., polycrystalline silicon doped with a dopant, but the embodiments are not limited thereto. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting," "in contact with," or "contact" another element, there are no intervening elements present at the point of contact.

In an embodiment, the gate stacking structure 120 may include a plurality of gate stacking structures 120*a* and 120*b* sequentially stacked on the second substrate 110, and the channel structure CH may include a plurality of channel structures CH1 and CH2 that respectively penetrate the plurality of gate stacking structures 120*a* and 120*b*. Then, a number of stacked gate electros 130 may be increased and thus a number of memory cells may be increased with a stable structure. In the drawings, it is illustrated as an example that the gate stacking structure 120 includes two gate stacking structures 120*a* and 120*b*, but the embodiments are not limited thereto. Thus, the gate stacking structure 120 may include one gate stacking structure or three or more gate stacking structures.

The plurality of channel structures CH1 and CH2 constituting one channel structure CH may be electrically connected to each other. In a cross-sectional view, each of the plurality of channel structures CH1 and CH2 may have an inclined side surface such that a width of each of the plurality of channel structures CH1 and CH2 decreases toward the second substrate 110 according to an aspect ratio. Then, the extension portion 130*v* of the gate insulation layer 130*i*, a connection portion 140*d* or an extension portion 140*c* of the channel layer 140, or connection portions 152*d*, 154*d*, and 156*d* or extension portions 152*c*, 154*c*, and 156*c* of the resistance variable layer 150 may have an inclined side surface. As illustrated in FIG. 2, a bent portion due to a difference in widths of the first channel structure CH1 and the second channel structure CH2 may be provided at a connection portion of the first channel structure CH1 and the second channel structure CH2. In some embodiments, the plurality of channel structures CH1 and CH2 may have an inclined side surface that is continuously extended without the bent portion.

In FIG. 2, it is illustrated as an example that the channel layer 140, the resistance variable layer 150, and the core insulation layer 142 of the plurality of channel structures CH1 and CH2 may have an integral structure in which they continuously extend. However, the embodiments are not limited thereto. In some embodiments, channel layers 140, resistance variable layers 150, and core insulation layers 142 of the plurality of channel structures CH1 and CH2 may be separately formed and be electrically connected to each other. A separate channel pad may be additionally disposed at the connection portion of the plurality of channel structures CH1 and CH2. As such, the embodiments are not limited to a shape of a plurality of channel structures CH1 and CH2.

In an embodiment, the gate stacking structure 120 may be divided into a plurality of portions in a plan view by a separation structure 160 extending in a crossing direction (e.g., a vertical direction) crossing the second substrate 110 or in the extension direction (e.g., a Z-axis direction in the drawings) to penetrate the gate stacking structure 120. An upper separation region 162 may be at an upper portion of the gate stacking structure 120. In a plan view, a plurality of separation structures 160 and/or a plurality of upper separation regions 162 may extend in a first direction (a Y-axis direction in the drawings) and be spaced apart from each other at predetermined intervals in a second direction (an X-axis direction in the drawings) crossing the first direction.

In a plan view, a plurality of gate stacking structures 120 may extend in the first direction (a Y-axis direction in the drawings) and be spaced apart from each other at predetermined intervals in the second direction (an X-axis direction in the drawings). The gate stacking structure 120 divided by the separation portion 160 may constitute a memory cell block. However, the embodiments are not limited thereto, and a range of the memory cell block is not limited thereto.

For example, the separation structure 160 may penetrate the gate stacking structure 120 and extend to the second substrate 110, and the upper separation region 162 may separate one or a part of the plurality of gate electrodes 130 from each other. The upper separation region 162 may be between the separation structures 160.

For example, it is illustrated as an example that the separation structure 160 has an inclined side surface such that a width of the separation structure 160 gradually decreases toward the second substrate 110 in a cross-sectional view due to a high aspect ratio, but the embodiments are not limited thereto. The side surface of the separation structure 160 may be vertical to the second substrate 110 or may have a bent portion at a boundary portion of the plurality of stacking structures 120*a* and 120*b*.

The separation structure 160 or the upper separation region 162 may be filled with any of various insulating materials. For example, the separation structure 160 or the upper separation region 162 may include an insulating material such as silicon oxide, silicon nitride, or silicon oxynitride. However, the embodiments are not limited thereto, and a structure, a shape, a material, or the like of the separation structure 160 or the upper separation region 162 may be variously modified.

The connection region 104 and the second wiring portion 180 may be provided to connect the gate stacking structure 120 and the channel structure CH in the cell array region 102 to the circuit region 200 or an external circuit. The connection region 104 may be disposed at a periphery of the cell array region 102 and a part of the second wiring portion 180 may be in the connection region 104.

The second wiring portion 180 may include a member electrically connecting the gate electrode 130, the channel structure CH, the horizontal conductive layers 112 and 114, and/or the second substrate 110 to the circuit region 200 or an external circuit. For example, the second wiring portion 180 may include a bit line 182, a gate contact portion 184, a source contact portion 186, a through plug 188, a contact via 180*a* connected to each of the bit line 182, the gate contact portion 184, the source contact portion 186, and/or the through plug 188, and a connection wiring 190 connecting the bit line 182, the gate contact portion 184, the source contact portion 186, the through plug 188, and the contact via 180*a*.

The bit line 182 may be on the cell insulation layer 132 of the gate stacking structure 120 on the cell array region 102. The bit line 182 may extend in the second direction (an X-axis direction in the drawings) crossing the first direction in which the gate electrode 130 extends. The bit line 182 may be electrically connected to the channel structure CH (e.g., the channel pad 144) through the contact via 180*a* (e.g., a bit line contact via).

A plurality of gate electrodes 130 may extend in the first direction (a Y-axis direction in the drawings) in the connection region 104. Extension lengths of the plurality of gate electrodes 130 in the connection region 104 may be sequentially decreased as the plurality of gate electrodes 130 go away from the second substrate 110. For example, the plurality of gate electrodes 130 may have a stair shape in the connection region 104. In this instance, the plurality of gate electrodes 130 may have a stair shape in one direction or a plurality of directions. In the connection region 104, a plurality of gate contact portions 184 may penetrate the cell gate insulation layer 132 to be electrically connected to the plurality of gate electrodes 130, respectively, extending to the connection region 104.

In the drawings, the gate contact portion 184 may connect an upper portion of the gate electrode 130 and the connection wiring 190. However, the embodiments are not limited thereto. In some embodiments, the gate contact portion 184 may penetrate the gate electrode 130 and extend to the circuit region 200 to be electrically connected to the circuit region 200. Other various modifications are possible.

In the connection region 104, the source contact portion 186 may penetrate the cell insulation layer 132 to be electrically connected to the horizontal conductive layers 112 and 114 and/or to the second substrate 110. The through plug 188 may penetrate the gate stacking structure 120 or may be at an outside of the gate stacking structure 120 to be electrically connected to the first wire portion 230 of the circuit region 200.

The connection wiring 190 may be in the cell array region 102 and/or the connection region 104. The bit line 182, the gate contact portion 184, the source contact portion 186, and/or the through plug 188 may be electrically connected to the connection wiring 190. For example, the gate contact portion 184, the source contact portion 186 and/or the through plug 188 may be electrically connected to the connection wiring 190 through the contact via 180a.

In FIG. 1, it is illustrated as an example that the connection wiring 190 is a single layer on the same plane as the bit line 182 and a second insulation layer 192 is at a portion other than the second wiring portion 180. However, this is a brief illustration for convenience. For an electrical connection with the bit line 182, the gate contact portion 184, the source contact portion 186, and/or the through plug 188, the connection wiring 190 may include a plurality of wiring layers and may further include a contact via.

By the second wiring portion 180 and the first wiring portion 230, the bit line 182 connected to the channel structure CH, the gate electrode 130, the horizontal conductive layers 112 and 114, and/or second substrate 110 may be electrically connected to the circuit element 220 of the circuit region 200.

In FIG. 1, it is illustrated as an example that each of the gate contact portions 184, the source contact portion 186, and/or the through plug 188 has an inclined side surface such that a width of each of the gate contact portion 184, the source contact portion 186, and/or the through plug 188 decreases as each of the gate contact portion 184, the source contact portion 186, and/or the through plug 188 extends to the second substrate 110 due to an aspect ratio in a cross-sectional view, and a bent portion is provided at a boundary portion of the plurality of gate stacking structures 120a and 120b. However, the embodiments are not limited thereto. In some embodiments, the source contact portion 186 and/or the through plug 188 might not include the bent portion at the boundary portion of the plurality of gate stacking structures 120a and 120b. Other numerous variations are possible.

Hereinafter, referring FIG. 3 and FIG. 4, the resistance variable layer 150 according to an embodiment and the channel structure CH including the same will be described in more detail.

Figure 4:
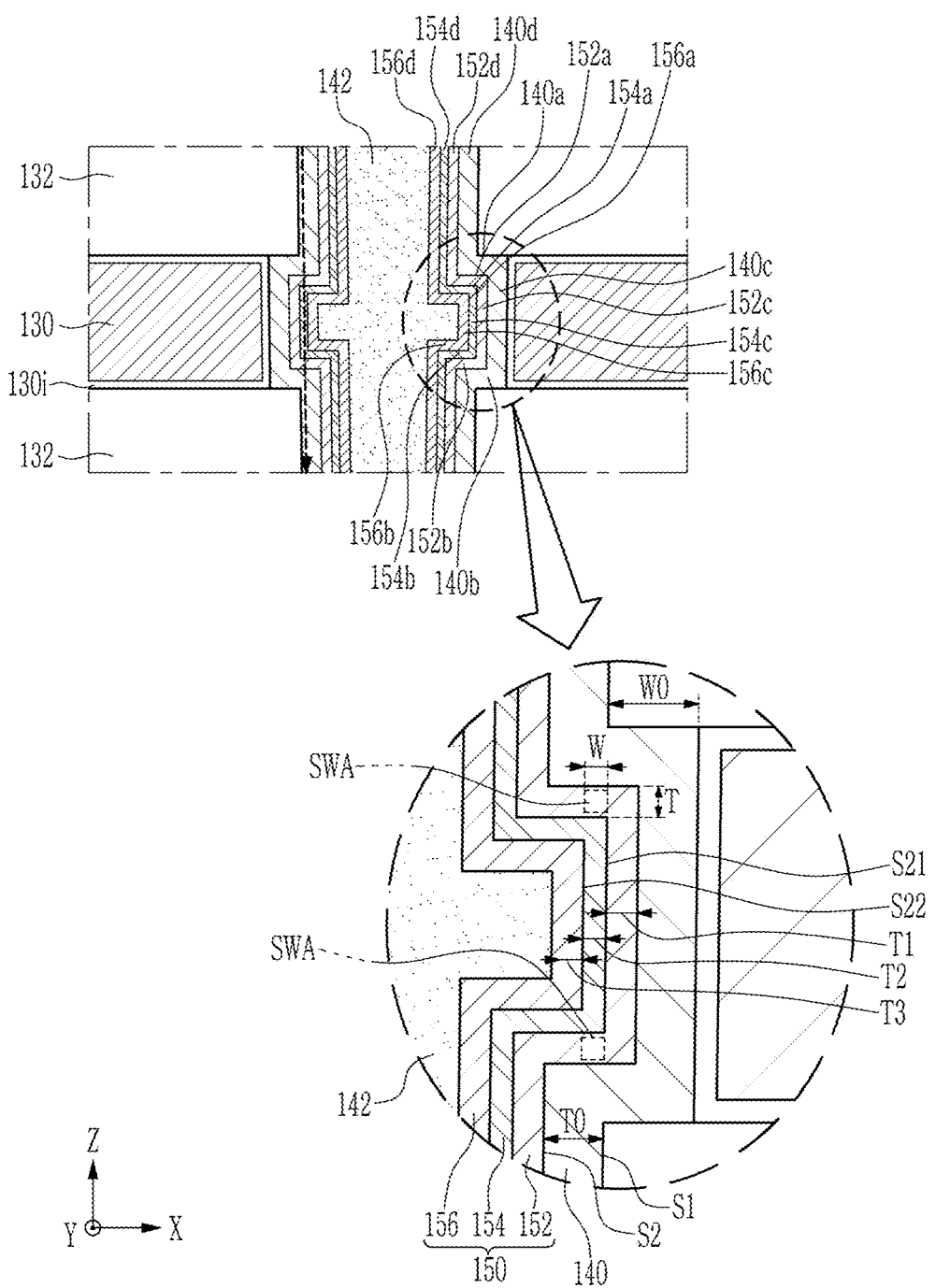
FIG. 4 is an enlarged partial cross-sectional view of a part of FIG. 3.

FIG. 4 is an enlarged partial cross-sectional view of a part of FIG. 3.

Referring FIG. 3 and FIG. 4, in an embodiment, one gate electrode 130, and portions of a gate insulation layer 130i, a channel layer 140, and a resistance variable layer 150 corresponding to the one gate electrode 130 may constitute one memory cell. The memory cell is configured as a resistive random access memory (RRAM) cell including the resistance variable layer 150, and may store information using a resistance change (an electrical resistance change) of the resistance variable layer 150 that occurs when voltage is applied.

In an embodiment, a side surface 122 of the gate stacking structure 120 where the resistance variable layer 150 is positioned may include a base surface 124 where a recess portion 122r is not positioned and a recess surface 126 constituting the recess portion 122r.

In an embodiment, a plurality of recess portions 122r may be at the side surface 122 of the gate stacking structure 120 where the resistance variable layer 150 is positioned to correspond to the plurality of gate electrodes 130 or the plurality of gate structures. In this instance, side surfaces of the plurality of cell insulation layers 132 may be the base surface 124. The recess surface 126 may include a first recess surface 126a, a second recess surface 126b, and a third recess 126c. The first recess surface 126a may be a lower surface of a cell insulation layer 132 at an upper portion of the recess portion 122r. The second recess surface 126b may be an upper surface of a cell insulation layer 132 at a lower portion of the recess portion 122r. The third recess surface 126c may be a side surface of the gate electrode 130 or the gate structure and connect the first recess surface 126a and the second recess surface 126b.

In this instance, the third recess surface 126c or side surfaces of the plurality of gate electrodes 130 or the plurality of gate structures may be disposed at an inner side in comparison to the plurality of base surfaces 124 or side surfaces of the plurality of cell insulation layers 132. In some embodiments, the third recess surface 126c or the side surfaces of the plurality of gate electrodes 130 or the plurality of gate structures may protrude beyond (e.g., in the X-axis direction) the plurality of base surfaces 124 or the side surfaces of the plurality of cell insulation layers 132.

In an embodiment, the channel layer 140 may be entirely and continuously formed on the side surface of the gate stacking structure 120 including the plurality of recess portions 122r. Accordingly, the channel layer 140 may have a shape repeatedly extending in the extension direction and the horizontal direction.

For example, the channel layer 140 may be repeatedly formed along the base surface 124 and the recess surface 126. Here, the phrase of an element is formed along the recess surface 126 may mean the case that the element is continuously formed on the first to third recess surfaces 126a, 126b, and 126c. That is, the channel layer 140 may include the plurality of expanded portions 140a, 140b, and 140c formed along the recess surfaces 126 of the plurality of recess portions 122r, respectively, and a connection portion 140d connecting the plurality of expanded portions 140a, 140b, and 140c on the base surface 124. Each of expanded portions 140a, 140b, and 140c may include an upper portion 140a extending in the horizontal direction on the first recess surface 126a, a lower portion 140b extending in the horizontal direction on the second recess surface 126b, and an extending portion 140c connecting the upper portion 140a and the lower portion 140b on the third recess surface 126c.

In an embodiment, the resistance variable layer 150 on the channel layer 140 may be entirely and continuously formed on the side surface 122 of the gate stacking structure 120 including the plurality of recess portions 122r. Accordingly, the resistance variable layer 150 may have a shape repeatedly extending in the extension direction and the horizontal direction.

In this instance, the resistance variable layer 150 may include a first portion 152 and a second portion 154. The first portion 152 may include first expanded portions 152a, 152b, and 152c formed along the recess surface 126 of the recess portion 122r. The second portion 154 may include second expanded portions 154a, 154b, and 154c formed along the recess surface 126 of the recess portion 122r on the first portion 152. The resistance variable layer 150 may include a third portion 156 on the second portion 154. The second expanded portions 154a, 154b, and 154c may respectively contact the first expanded portions 152a, 152b, and 152c.

For example, the first portion 152 may be formed along the base surface 124 and the recess surface 126 on the channel layer 140. That is, the first portion 152 may include a plurality of first expanded portions 152a, 152b, and 152c formed along the recess surfaces 126 of the plurality of recess portions 122r, respectively, on the expanded portions 140a, 140b, and 140c, and a first connection portion 152d connecting the plurality of first expanded portions 152a, 152b, and 152c on the connection portion 140d on the base surface 124. The first expanded portions 152a, 152b, and 152c may be respectively referred to as a first upper portion 152a, a first lower portion 152b, and a first extension portion 152c. The first upper portion 152a may extend in the horizontal direction on the upper portion 140a on the first recess surface 126a. The first lower portion 152b may extend in the horizontal direction on the lower portion 140b on the second recess surface 126b. The first extension portion 152c may connect the first upper portion 152a and the first lower portion 152b on the extension portion 140c on the third recess surface 126c.

The second portion 154 may be formed along the base surface 124 and the recess surface 126 on the first portion 152. That is, the second portion 154 may include a plurality of second expanded portions 154a, 154b, and 154c formed along the recess surfaces 126 of the plurality of recess portions 122r, respectively, on the first expanded portions 152a, 152b, and 152c, and a second connection portion 154d connecting the plurality of second expanded portions 154a, 154b, and 154c on the first connection portion 152d on the base surface 124. The second expanded portions 154a, 154b, and 154c may be respectively referred to as a second upper portion 154a, a second lower portion 154b, and a second extension portion 154c. The second upper portion 154a may extend in the horizontal direction on the first upper portion 152a on the first recess surface 126a. The second lower portion 154b may extend in the horizontal direction on the first lower portion 152b on the second recess surface 126b. The second extension portion 154c may connect the second upper portion 154a and the second lower portion 154b on the first extension portion 152c on the third recess surface 126c.

The third portion 156 may be formed along the base surface 124 and the recess surface 126 on the second portion 154. That is, the third portion 156 may include a plurality of third expanded portions 156a, 156b, and 156c formed along the recess surfaces 126 of the plurality of recess portions 122r, respectively, on the second expanded portions 154a, 154b, and 154c, and a third connection portion 156d connecting the plurality of third expanded portions 156a, 156b, and 156c on the second connection portion 154d on the base surface 124. The third expanded portions 156a, 156b, and 156c may be respectively referred to as a third upper portion 156a, a third lower portion 156b, and a third extension portion 156c. The third upper portion 156a may extend in the horizontal direction on the second upper portion 154a on the first recess surface 126a. The third lower portion 156b may extend in the horizontal direction on the second lower portion 154b on the second recess surface 126b. The third extension portion 156c may connect the third upper portion 156a and the third lower portion 156b on the second extension portion 154c on the third recess surface 126c. The second expanded portions 154a, 154b, and 154c may respectively contact the third expanded portions 156a, 156b, and 156c.

However, the embodiments are not limited thereto. In some embodiments, in the recess portion 122r, the third portion 156 may entirely fill an inside space surrounded by the second expanded portions 154a, 154b, and 154c.

In an embodiment, the first portion 152, the second portion 154, and/or the third portion 156 may include transition metal oxide including transition metal and oxygen or semiconductor oxide including semiconductor material and oxygen. For example, the first portion 152, the second portion 154, or the third portion 156 may include oxide including at least one of vanadium (V), manganese (Mn), tin (Sn), titanium (Ti), zirconium (Zr), hafnium (Hf), tungsten (W), aluminum (Al), tantalum (Ta), zinc (Zn), nickel (Ni), rubidium (Rb), gadolinium (Gd), copper (Cu), molybdenum (Mo), and silicon (Si). For example, the first portion 152, the second portion 154, or the third portion 156 may include at least one of $V_2O_5$, $MnO_2$, $SnO_2$, $TiO_2$, $ZrO_2$, $HfO_2$, $WO_3$, $Al_2O_3$, $Ta_2O_5$, $ZnO$, $NiO$, $Rb_2O$, $Gd_2O_3$, $CuO$, $MoO_3$, and $SiO_2$. In some embodiments, the first portion 152, the second portion 154, or the third portion 156 may include oxide having an energy bandgap of 2 eV or more. When the resistance variable layer 150 includes the above material, information may be stored by using a resistance change of the resistance variable layer 150 that occurs when voltage is applied. In an embodiment, the second portion 154 may have a material, composition, or resistance different from a material, composition, or resistance of the first portion 152 and/or the third portion 156. For example, the second portion 154 may have a resistance smaller than a resistance of the first portion 152, and the second portion 154 may have a resistance smaller than a resistance of the third portion 156. The first portion 152 may have a resistance larger than the resistance of the second portion 154 and thus include a memory switching region SWA for changing an on state or an off state of the memory cell. The second portion 154 may have a relatively small resistance in comparison to the first portion 152 and/or the third portion 156 to provide a current path. The third portion 156 may have a density larger than a density of the second portion 154 and thus may prevent an outer material from inflowing to the resistance variable layer 150. That is, the third portion 156 may be a kind of a barrier region.

For example, a ratio of the resistance of the first portion 152 and/or the third portion 156 to the resistance of the second portion 154 may be 100 or more (e.g., 100 to 1,000,000). Within the above range, the second portion 154 has a small resistance and thus may stably provide the current path. However, the embodiments are not limited thereto, and the ratio may be smaller than 100 or larger than 1,000,000.

In some embodiments, operating voltage of a material included in the second portion 154 may be smaller than an operating voltage of a material included in the first portion 152 and/or the third portion 156. Here, the operating voltage may refer to voltage in which a filament is grown by an electric field so that a current flows. For example, the operating voltage of the second portion 154 may be smaller than the operating voltage of the first portion 152 and/or the third portion 156 by 2V or more (e.g., 2V to 20V). Within the range, the first portion 152 including the memory switching region SWA and the second portion 154 providing the current path may sufficiently perform their roles. However, the embodiments are not limited thereto, and a difference in operating voltage may be smaller than 2V or larger than 20V.

In an embodiment, the first portion 152 and the second portion 154, include the same oxide and have different compositions. The third portion 156 may include the same oxide as the first portion 152 and the second portion 154, and have different compositions from the first portion 152 and the second portion 154. More particularly, an oxygen amount of the second portion 154 may be smaller than an oxygen amount of the first portion 152 and/or the third portion 156. In some embodiments, the second portion 154 may include more oxygen vacancy than the first portion 152 and/or the third portion 156.

The second portion 154 may have a non-stoichiometric composition in comparison to the first portion 152 and/or the third portion 156, and the first portion 152 and/or the third portion 156 may have a stoichiometric composition in comparison to the second portion 154. In some embodiments, the second portion 154 may have a lower stoichiometry than the first portion 152 and/or the third portion 156, and the first portion 152 and/or the third portion 156 may have a higher stoichiometry than the second portion 154. In some embodiments, a Gibbs free energy of the first portion 152 and/or the third portion 156 may be smaller than a Gibbs free energy of the second portion 154. Then, the first portion 152 and/or the third portion 156 may be chemically stable and the oxygen of the first portion 152 and/or the third portion 156 might not move to the second portion 154. Accordingly, properties of the first portion 152, the second portion 154 and the third portion 156 may be maintained.

The oxygen amount of the second portion 154 may be relatively small and the oxygen vacancy amount of the second portion 154 may be relatively large, and thus, a defect formation energy (DFE) may be reduced and filaments may be easily formed. Then, the second portion 154 has the relatively small operating voltage. The oxygen amount of the first portion 152 may be relatively large and the oxygen vacancy amount of the first portion 152 may be relatively small, and thus, a leakage current may be reduced and a switching property having high reliability may be secured. The oxygen amount of the third portion 156 may be relatively large and the oxygen vacancy amount of the third portion 156 may be relatively small, and the third portion 156 may have a higher density than the second portion 154. Accordingly, the third portion 156 may stably prevent an outer material from inflowing.

According to an embodiment, by adjusting the composition of the first portion 152 and the second portion 154, and/or the third portion 156, the resistances, the operating voltage, or the like of the first portion 152 and the second portion 154, and/or the third portion 156 may be easily adjusted to have a wanted value. In addition, unpredictable problems may be prevented or suppressed from occurring when having different materials.

In an embodiment, each of the first portion 152 and the second portion 154 may include zinc oxide. The third portion 156 may also include zinc oxide. The zinc oxide may be suitable for being applied to the resistive random access memory cell because the resistance may be stably changed by electric field.

For example, the first portion 152 may have a chemical formula of ZnOx, and the second portion 154 may have a chemical formula of ZnOy. The third portion 156 may have a chemical formula of ZnOz. Here, x may be 0.8 to 1, z may be 0.8 to 1, and y may be smaller than x and z and be 0.5 to 0.8. If x is smaller than 0.8, the leakage current may be large. If z is smaller than 0.8, a density of the third portion 156 might not be sufficient and may sufficiently act as the barrier region. If y is smaller than 0.5, the leakage current may be large. If y is larger than 0.8, the resistance of the second portion 154 might not be sufficiently reduced. However, the embodiments are not limited thereto. Therefore, x or z may be smaller than 0.8, and y may be smaller than 0.5 or larger than 0.8.

In the above description, the first portion 152 and the second portion 154, and/or the third portion 156 include the same oxide (e.g., zinc oxide) and have different compositions as an example, but the embodiments are not limited thereto. In this instance, a Gibbs free energy of the first portion 152 and/or the third portion 156 may be smaller than a Gibbs free energy of the second portion 154, or the first portion 152 and/or the third portion 156 may have a stoichiometric composition in comparison to the second portion 154 or may have a higher stoichiometry in comparison to the second portion 154. In some embodiments, the third portion 156 acting as the barrier region may include a material different from a material of the first portion 152 and/or the second portion 154.

In an embodiment, the side surface 122 of the gate stacking structure 120 includes the recess portion 122r, and the resistance variable layer 150 provided at the same may include the first portion 152 and the second portion 154 having different materials, compositions, or resistances. That is, a portion of the resistance variable layer 150 formed along the recess surface 126 may include the first expanded portions 152a, 152b, and 152c and the second expanded portions 154a, 154b, and 154c having different materials, compositions, or resistances. Accordingly, a size of the memory switching region SWA may be minimized.

In the extension direction of the channel structure CH (e.g., in the Z-axis direction), a portion where the channel layer 140, the resistance variable layer 150, and the channel layer 140 are sequentially positioned may be included by the recess portion 122r. More particularly, in the extension direction of the channel structure CH, a portion where the first upper portion 152a of the first portion 152, the second portion 154, and the first lower portion 152b of the first portion 152 are sequentially positioned may be included. More particularly, in the extension direction of the channel structure CH, the first upper portion 152a of the first portion 152, the second portion 154, and the first lower portion 152b of the first portion 152 are sequentially positioned to correspond to the recess portion 122r between the plurality of connection portions 140d on the plurality of base surfaces 124.

Accordingly, a direction of a driving current and a direction of an electric field applied to the resistance variable layer 150 coincide with each other within the recess portion 122r. That is, the operating voltage of the resistance variable layer 150 may be reduced by effectively applying the electric field to the resistance variable layer 150 due to the recess portion 122r. Therefore, operating voltage of the memory cell for a program operation, an erase operation, a read operation, or the like may be reduced. On the other hand, when a resistance variable layer is provided on a side surface of a gate stacking structure and a recess portion is not provided on the side surface of the gate stacking structure, a stacked structure of a channel layer and the resistance variable layer is positioned in the horizontal direction and thus a weak electric field distribution is applied and operating voltage of the resistance variable layer is large.

In an embodiment, the resistance variable layer 150 includes the second portion 154 having a smaller resistance than the first portion 152 and/or the third portion 156 and thus the size of the memory switching region SWA for changing the on state or the off state of the memory cell. For example, a part of the first portion 152 of the resistance variable layer 150 may constitute the memory switching region SWA and thus the size of the memory switching region SWA may be minimized. The second portion 154 of the resistance variable layer 150 provides the current path when the memory cell is in the on state and thus does not correspond to the memory switching region SWA.

More particularly, in a plan view, a part of the first upper portion 152a and a part of the first lower portion 152b overlapping the connection portion 140d of the channel layer 140 in the vertical direction (e.g., in the Z-axis direction) may correspond to the memory switching regions SWA. For example, as illustrated in FIG. 4, a width W of the memory switching region SWA in the first upper portion 152a or the first lower portion 152b may be substantially the same as a thickness T2 of the second portion 154. Although not illustrated, a width W of the memory switching region SWA in the first upper portion 152a or the first lower portion 152b may be substantially the same as a thickness T0 of the connection portion 140d of the channel layer 140, or a thickness of an overlapping portion of the channel layer 140 and the second portion 154. A thickness T (measured in the vertical direction, X-axis direction) of the memory switching region SWA may be substantially the same as a thickness T1 (measured in the horizontal direction, X-axis direction) of the first portion 152. Here, the phrase that two thicknesses are substantially the same may include a case in which they are the same and a case in which there is a difference within of the process error (e.g., a difference within 10%).

As such, the memory switching region SWA of the resistance variable layer 150 may be a region limited by the thickness T0 of the channel layer 140 or the thickness T2 of the second portion 154, and the thickness T1 of the first portion 152. That is, a region where the memory switching occurs is limited in the horizontal direction by the recess portion 122r at the side surface 122 of the gate stacking structure 120, and the width W and the thickness T of the memory switching region SWA may be additionally limited by the resistance variable layer 150 including the first portion 152 and the second portion 154, and/or the third portion 156. Accordingly, the size of the memory switching region SWA may be effectively reduced.

When the size of the memory switching region SWA is minimized as in the above, a thickness of the filament may be reduced by effectively limiting a random growth of the filament occurred when the electric field is applied. Accordingly, the operating voltage may be reduced and the operating voltage distribution may be effectively reduced.

Unlike this, if a resistance variable layer is formed of one layer even when a recess portion is provided, a size of a memory switching region where memory switching occurs is proportional to a size of the recess portion (e.g., a length of the resistance variable layer in the recess portion). Here, the length of the resistance variable layer in the recess portion may refer to a vertical length of a portion of the resistance variable layer between an upper portion and a lower portion of a channel layer in the recess portion in a direction crossing (e.g., perpendicular to) the second substrate 110 (in a Z-axis direction of the drawings). Therefore, a size of the recess portion needed to be reduced in order to reduce a size of the memory switching region, but it was difficult to make the recess portion smaller than a certain level due to a limit in a process. Accordingly, even if the area where memory switching occurs is limited, it was difficult to further limit the memory switching region.

In an embodiment, in a plan view, the connection portion 140d of the channel layer 140 may overlap the second portion 154. Particularly, the connection portion 140d of the channel layer 140 may overlap the second extension portion 154c of the second portion 154. The part of the first upper portion 152a and the part of the first lower portion 152b between the plurality of connection portions 140d of the channel layer 140 may constitute the memory switching region SWA, and the current may flow through the second portion 154 between the part of the first upper portion 152a and the part of the first lower portion 152b. When the second portion 154 (e.g., the second extension portion 154c) overlaps the channel layer 140 in a plan view, the current path may be effectively reduced.

The connection portion 140d has a first surface S1 adjacent to the base surface 124 and a second surface S2 opposite to the first surface S1. For example, a first surface S21 of the second extension portion 154c adjacent to the side surface 122 of the gate stacking structure 120 may be closer to the third recess surface 126c than the second surface S2 of the connection portion 140d. For example, as illustrated in FIG. 4, the first surface S21 of the second extension portion 154c may be on the same plane as the first surface S1 of the connection portion 140d adjacent to the base surface 124. Although not illustrated, the first surface S21 of the second extension portion 154c may be farther away from the third recess surface 126c than the first surface S1 of the connection portion 140d adjacent to the base surface 124. As further illustrated in FIG. 4, the second surface S22 of the second extension portion 154c opposite to the side surface 122 of the gate stacking structure 120 may be closer to the third recess surface 126c than the second surface S2 of the connection portion 140d. Although not illustrated, the second surface S22 of the second extension portion 154c opposite to the side surface 122 of the gate stacking structure 120 may be on the same plane as the second surface S2 of the connection portion 140d adjacent to the base surface. Accordingly, an operation region of the memory cell is at an outside of the recess portion 122r and the channel layer 140 and thus the memory cell may be stably operated. However, the embodiments are not limited thereto, and the second surface S22 of the second extension portion 154c may be farther away from the recess surface 126c than the second surface S2 of the connection portion 140d.

In some embodiments, a width WO of the recess portion 122r may be larger than the thickness T0 of the channel layer 140, and may be the same as or smaller than a sum of the thickness T0 of the channel layer 140 and the thickness of the resistance variable layer 150. For example, the width WO of the recess portion 122r in the horizontal direction may be the same as or smaller than a sum of the thickness T0 of the channel layer 140, the thickness T1 of the first portion 152, and the thickness T2 of the second portion 154.

According to the above, the connection portion 140d of the channel layer 140 stably overlaps the second extension portion 154c of the second portion 154 in a plan view, thereby reducing the current path. However, the embodiments are not limited thereto. In some embodiments, the width WO of the recess portion 122r in the horizontal direction may be larger than the sum of the thickness T0 of the channel layer 140 and the thickness of the resistance variable layer 150. Other numerous variations are possible.

For example, the width WO of the recess portion 122r may be the same as or smaller than the thickness TG of the gate structure, the thickness of the interlayer insulation layer 132m, or the thickness of the recess portion 122r. Thereby, the operating voltage distribution of the memory cell may be effectively reduced. In some embodiments, the width WO of the recess portion 122r may be larger than the thickness TG of the gate structure, the thickness of the interlayer insulation layer 132m, or the thickness of the recess portion 122r. In the extension direction, the thickness of the recess portion 122r may be substantially the same as the thickness TG of the gate structure. However, the embodiments are not limited thereto.

In an embodiment, the thickness T2 of the second portion 154 may be the same as or may be smaller than the thickness T1 of the first portion 152 and/or a thickness T3 of the third portion 156. For example, the thickness T1 of the first portion 152 may be larger than the thickness T2 of the second portion 154 to stably form the memory switching region SWA, and the thickness T3 of the third portion 156 may be larger than the thickness T2 of the second portion 154 so that the third portion 156 stably acts as the barrier region. Since the second portion 154 has the smaller resistance than the first portion 152 and/or the third portion 156, the current may stably flow even though the thickness of the second portion 154 is relatively small.

The thickness T3 of the third portion 156 may be the same as or larger than the thickness T1 of the first portion 152. For example, the thickness T3 of the third portion 156 may be larger than the thickness T1 of the first portion 152. Thereby, the third portion 156 may stably act as the barrier region.

For example, the thickness T2 of the second portion 154 may be 0.5 nm to 5 nm, and the thickness T1 of the first portion 152 and/or the thickness T3 of the third portion 156 may be 0.5 nm to 10 nm.

However, the embodiments are not limited thereto. Therefore, the thickness T2 of the second portion 154 may be larger than the thickness T1 of the first portion 152 and/or the thickness T3 of the third portion 156. In some embodiments, the thickness T3 of the third portion 156 may be smaller than the thickness T1 of the first portion 152. In some embodiments, the thickness T2 of the second portion 154 may be smaller than 0.5 nm or larger than 5 nm, and the thickness T1 of the first portion 152 and/or the thickness T3 of the third portion 156 may be smaller than 0.5 nm or larger than 10 nm.

The thickness T0 of the channel layer 140 may be a thickness that satisfies the resistance property. For example, the thickness T2 of the second portion 154 may be the same as or larger than the thickness T0 of the channel layer 140. Then, the current of the memory switching region SWA of the first portion 152 corresponding to the connection portion 140d of the channel layer 140 may stably flow to the second portion 154. In some embodiments, the thickness T1 of the first portion 152 and/or the thickness T3 of the third portion 156 may be the same as or larger than the thickness T0 of the channel layer 140. Thereby, the memory switching region SWA may be stably formed in the first portion 152, and the third portion 156 may stably prevent an outer material from inflowing.

In some embodiments, the thickness T1 of the first portion 152, the thickness T2 of the second portion 154, and/or the thickness T3 of the third portion 156 may be smaller than the thickness T0 of the channel layer 140. Thereby, the thickness of the channel layer 140 may be sufficiently secured and the resistance of the channel layer 140 may be reduced.

In an embodiment, the thickness T1 of the first portion 152 or the thickness T2 of the second portion 154 may be the same as or smaller than the thickness of the gate insulation layer 130i. The thickness T3 of the third portion 156 may be the same as or larger than the thickness of the gate insulation layer 130i. However, the embodiments are not limited thereto. The thickness T1 of the first portion 152 or the thickness T2 of the second portion 154 may be larger than the thickness of the gate insulation layer 130i. The thickness T3 of the third portion 156 may be smaller than the thickness of the gate insulation layer 130i.

The above thicknesses of the channel layer 140, the resistance variable layer 150, and the gate insulation layer 130i are examples and the embodiments are not limited thereto. Therefore, the thicknesses of the resistance variable layer 150 and the channel layer 140 may be varied.

A driving method of the semiconductor device 10 including a memory cell of a resistive random access memory cell is described below.

As illustrated in FIG. 4, in a memory cell selected in a program operation or a read operation, a voltage for the program operation or the read operation is applied to the channel layer 140, and the gate electrode 130 is unselected or turned off. Then, oxygen vacancies in the memory switching region SWA of the resistance variable layer 150 move to one side to form a filament, and the second portion 154 having a smaller resistance than the first portion 152 may be the passage where the current flows. As indicated by the arrow in FIG. 4, the current moved along the connection portion 140d of the channel layer 140 moves along the memory switching region SWA of the first upper portion 152a, the second portion 154, and the memory switching region SWA of the first lower portion 152b in a path spaced apart from the gate electrode 130, and then, moves to another connection portion 140d of the channel layer 140 at the lower portion. The memory cell selected in the program operation stores data 1 (i.e., logic "1") or is turned on. In the read operation, data of the memory cell may be read. Although the current flow is indicated by the arrow in FIG. 4 for illustrative purposes, the embodiments are not limited thereto.

In a memory cell that is not selected in the program operation, the voltage for the program operation is applied to the channel layer 140, but the gate electrode 130 is selected or turned on. When the gate electrode 130 is turned on, the current flows along the channel layer 140 in a path adjacent to the gate electrode 130 and does not flow to the resistance variable layer 150. As a result, the memory cell unselected in the program operation stores data 0 (i.e., logic "0") or is turned off.

In a memory cell selected in an erase operation, a voltage for the erase operation is applied to the channel layer 140 and the gate electrode 130 is unselected or turned off. Then, the current flows through the channel layer 140 and the resistance variable layer 150, but the current direction in the erase operation is opposite to the current direction in the program operation. As a result, the memory cell selected in the erase operation stores data 0 or is turned off.

According to the embodiment, the memory cell is configured as the resistive random access memory cell, thereby preventing or suppressing interference between neighboring memory cells. Accordingly, the thickness of the gate electrodes 130 may be reduced, thereby increasing the number of gate electrodes 130 and increasing a memory capacity. On the other hand, if a memory cell is configured as a charge trap flash (CTF) driven by storing charge unlike the embodiment, an interference phenomenon in which the charge stored in a memory cell escapes to a peripheral memory cell may occur. In the charge trap flash, due to the large interference between the memory cells, there is a limit in reducing a thickness of the gate electrode to increase the number of gate electrodes.

By the recess portion 122r provided at the side surface 122 of the gate stacking structure 120, an electric field may be effectively applied to the resistance variable layer 150 at the side surface 122 of the gate stacking structure 120 and thus the operating voltage of the resistance variable layer 150 may be reduced. In this instance, the resistance variable layer 150 including the first portion 152 and the second portion 154 having different resistances, and thus, the size of the memory switching region SWA may be minimized and the operating voltage may be reduced and the operating voltage distribution may be effectively reduced.

In the above, the resistance variable layer 150 includes the first portion 152 and the second portion 154, and/or the third portion 156. However, a boundary between the first portion 152, the second portion 154, and/or the third portion 156 might not be clear. The present embodiment may also include instance in which the resistance variable layer 150 includes a plurality of portions having different materials, compositions, or resistances in the recess portion 122r.

The semiconductor device 10 may be a NAND flash memory device. The plurality of gate electrodes 130 or the plurality of gate structures correspond to a plurality of electrodes, the gate stacking structure 120 corresponds to a stacking structure, and the channel structure CH including the channel layer 140 and the resistance variable layer 150 is included. In this instance, the plurality of recess portions 122r may correspond to the plurality of gate electrodes 130 or the plurality of gate structures, respectively. However, the embodiments are not limited thereto. A recess portion may correspond to an insulation layer, and this will be described later in more detail with reference to FIG. 8, FIG. 9, and FIG. 11.

An example of a manufacturing method of the semiconductor device 10 will be described in detail with reference to FIG. 5A to FIG. 5D. To the extent that an element is not described in detail below, it may be understood that the element is at least similar to a corresponding element that has been described elsewhere within the present disclosure. A portion which is not described in the above will be described in detail.

FIG. 5A to FIG. 5D are partial cross-sectional views illustrating a manufacturing method of a semiconductor device 10 according to an embodiment. The portion illustrated in FIG. 3 is mainly illustrated in FIG. 5A to FIG. 5D. Hereinafter, a manufacturing method of a semiconductor device 10 will be mainly described for a gate stacking structure 120 and a channel structure CH in a cell area 100.

Figure 5A:
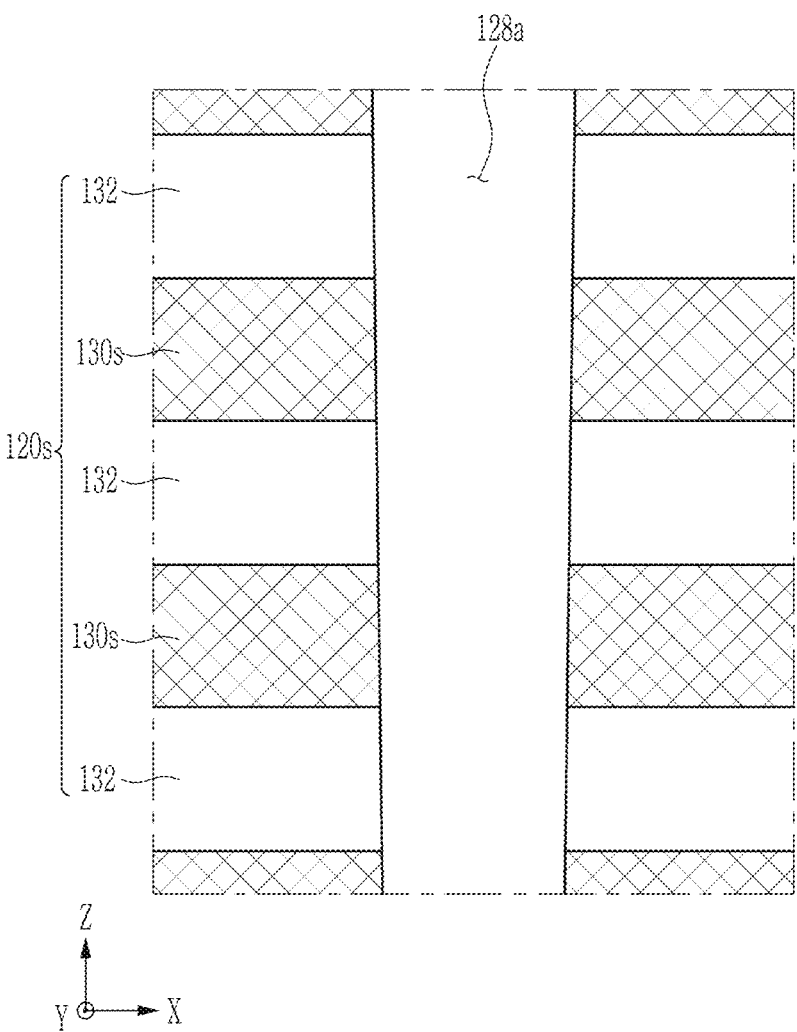
FIG. 5A to FIG. 5D are partial cross-sectional views illustrating a manufacturing method of a semiconductor device according to an embodiment.

Referring to FIG. 5A, a horizontal insulation layer 116 (refer to FIG. 1) and a second horizontal conductive layer 114 (refer to FIG. 1) may be formed on a second substrate 110 (refer to FIG. 1), a stack structure 120s may be formed by alternately stacking sacrificial insulation layers 130s and cell insulation layers 132, and then, a penetration portion 128a of a penetration region 128 (refer to FIG. 5B) penetrating the stack structure 120s may be formed.

Here, the sacrificial insulation layer 130s may be a layer to be replaced with a gate electrode 130 (refer to FIG. 5D) or the like through a subsequent process, and at least a part of the horizontal insulation layer 116 may be replaced with a first horizontal conductive layer 112 (refer to FIG. 1) through a subsequent process. That is, the sacrificial insulation layer 130s may be formed to correspond to a portion where the gate electrode 130 or the like is to be formed, and the horizontal insulation layer 116 may be formed to include a portion where the first horizontal conductive layer 112 is to be formed.

The horizontal insulation layer 116 and/or the sacrificial insulation layer 130s may be formed of or include a material different from a material of the cell insulation layers 132. For example, the cell insulation layer 132 may include silicon oxide, silicon nitride, silicon oxynitride, a low dielectric constant material, or the like, and the sacrificial insulation layer 130s may include a material different from that of the cell insulation layer 132 and may include one of silicon, silicon oxide, silicon carbide, silicon nitride, and the like.

The penetration portion 128a of the penetration region 128 may be a portion that longitudinally extends in a crossing direction crossing the second substrate 110 (i.e., a vertical direction perpendicular to the second substrate 110 or a Z-axis direction in the drawings). The penetration portion 128a may be formed by an etching process, e.g., an anisotropic etching process. The penetration portion 128a may be formed by etching the stack structure 120s in the crossing direction (i.e., the vertical direction) or the extension direction.

When viewed in a cross-sectional view, an overall side surface of the penetration portion 128a may be configured as a continuous inclined surface having an entirely constant slope such that a width of the penetration portion 128a gradually decreases toward the second substrate 110. In some embodiments, an overall side surface of the penetration portion 128a may be configured as a vertical surface perpendicular to the second substrate 110. However, the embodiments are not limited to a shape of the penetration portion 128a, and the penetration portion 128a may have any of various shapes entirely penetrating the stack structure 120s. In an embodiment, the stack structure 120s may include a first stack structure and a second stack structure corresponding to a first gate stacking structure 120a (refer to FIG. 1) and a second gate stacking structure 120b (refer to FIG. 1), respectively. The penetration portion 128a may include a first penetration portion formed by penetrating the first stack structure to provide a partial portion of a space in which a first channel structure CH1 (refer to FIG. 1) is to be formed, and a second penetration portion formed by penetrating the second stack structure to provide a partial portion of a space in which a second channel structure CH2 (refer to FIG. 1) is to be formed.

As an example, the first stack structure may be formed, the first penetration portion may be formed at the first stack structure, the second stack structure may be formed, and the second penetration portion may be formed at the second stack structure. In some embodiments, after the first stack structure and the second stack structure are formed, the second penetration portion is formed and then the first penetration portion may be formed through the second penetration portion. A process, an order, or the like of forming the stack structures and the penetration region may be variously modified.

Figure 5B:
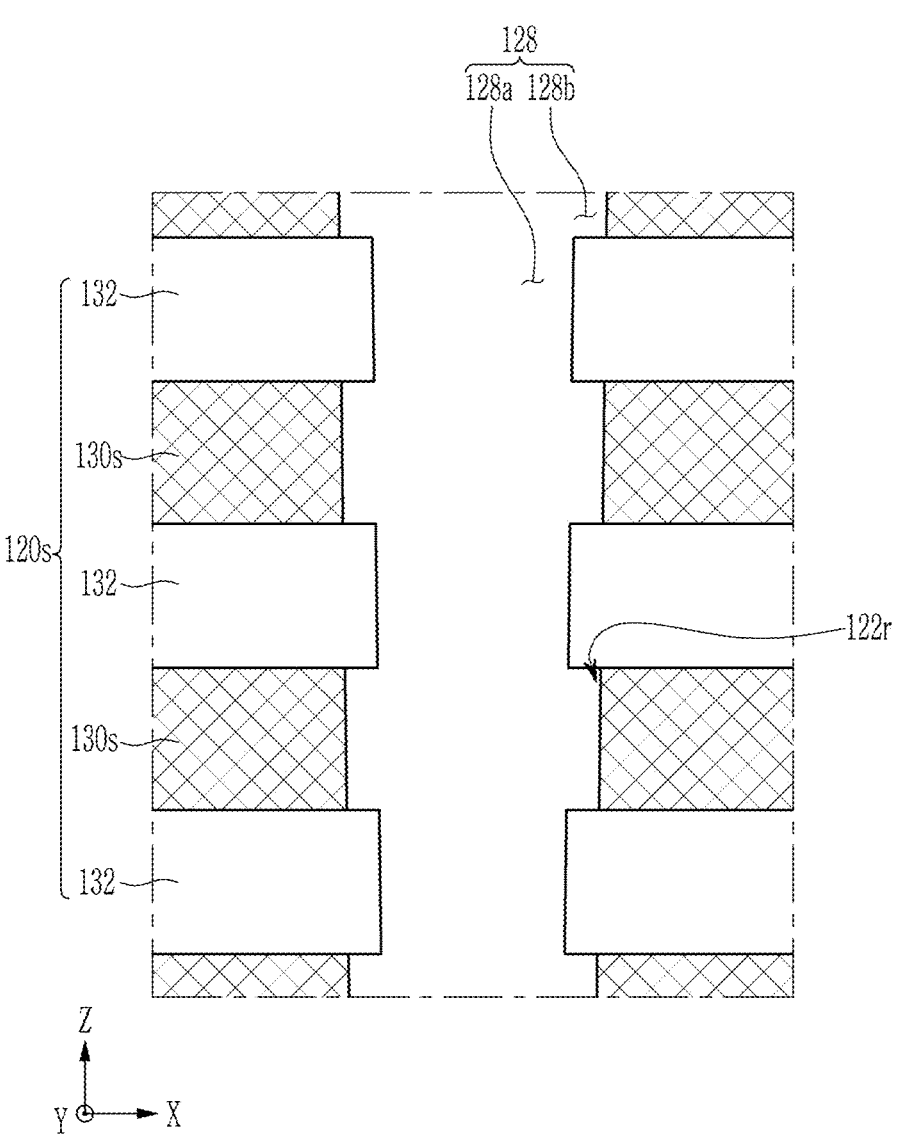

Subsequently, as illustrated in FIG. 5B, a protrusion portion 128b of the penetration region 128 may be formed by etching the sacrificial insulation layers 130s in a horizontal direction parallel to an upper surface of the second substrate 110. Accordingly, a part of each of the plurality of sacrificial insulation layers 130s adjacent to the protrusion portion 128b of the penetration region 128 may be removed, such that recess portions 122r correspond to the plurality of sacrificial insulation layers 130s, respectively.

More particularly, the protrusion portion 128b of the penetration region 128 may be formed by removing a partial portion of the sacrificial insulation layer 130s exposed through the penetration portion 128a of the penetration region 128 in a horizontal direction. When an etching material is introduced through the penetration portion 128a, a partial portion of the sacrificial insulation layer 130s adjacent to the penetration portion 128a may be etched in the horizontal direction, thereby forming the protrusion portion 128b. As a result, the recess portions 122r may be formed. In this instance, the etching may be performed upward and downward of the sacrificial insulation layer 130s as well, and the protrusion portion 128b may be slightly thicker than the sacrificial insulation layer 130s, but the embodiments are not limited thereto. Since the protrusion portion 128b is formed by etching the sacrificial insulation layer 130s in the horizontal direction through the penetration portion 128a as described above, a side surface of each of the protrusion portion 128b may have a relatively small slope, be convex toward the sacrificial insulation layer 130s or the gate electrode 130, or include a rounded portion.

The penetration region 128 including the penetration portion 128a and the protrusion portion 128b may be a portion penetrating the stack structure 120s to provide a space in which the channel structure CH (refer to FIG. 1) is to be formed.

Figure 5C:
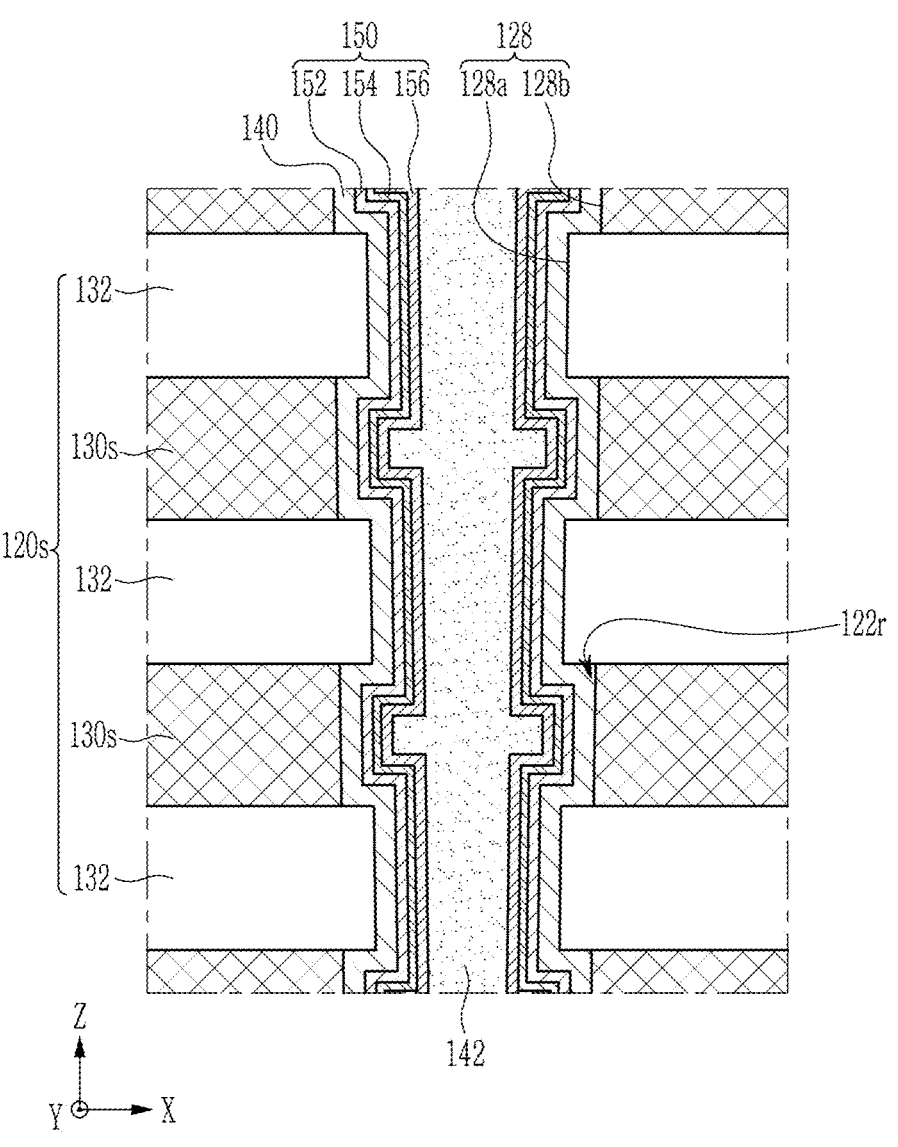

Subsequently, as illustrated in FIG. 5C, a channel layer 140 and a resistance variable layer 150 may be sequentially formed on a side surface of the penetration region 128 entirely and continuously in the penetration region 128. A core insulation layer 142 may be formed and a channel pad 144 (refer to FIG. 1) may be formed on the channel layer 140 to form the channel structure CH.

More particularly, the channel layer 140 and the resistance variable layer 150 are sequentially formed on the side surface of the gate stacking structure 120 including the plurality of recess portions 122r. The channel layer 140 and the resistance variable layer 150 may repeatedly extend in the crossing direction and in the horizontal direction.

The channel layer 140 and the resistance variable layer 150 may be formed using an atomic layer deposition process or a chemical vapor deposition (CVD) process. As an example, in a case where the atomic layer deposition process is used, the channel layer 140 and the resistance variable layer 150 may be stably formed in the penetration region 128 including the penetration portion 128a having a narrow and long shape and the protrusion portion 128b extended from the penetration portion 128a. However, the embodiments are not limited thereto, and any of various other processes may be applied.

As an example, the channel layer 140 may be formed by depositing a material constituting the channel layer 140 to have a first thickness, performing a crystallization process, and then, partially etching the deposited material to have a second thickness smaller than the first thickness. However, the embodiments are not limited thereto, and the channel layer 140 may be formed by any of various processes.

In an embodiment, the first portion 152 and the second portion 154 may include the same material and have different compositions. The third portion 156 may include the same material as the first portion 152 and the second portion 154, and have different compositions from the first portion 152 and the second portion 154. For example, an oxygen amount of the second portion 154 may be smaller than an oxygen amount of the first portion 152 and/or the third portion 156. After the first portion 152, the second portion 154, or the third portion 156 may be formed by using the atomic layer deposition process, a composition (e.g., an oxygen amount) may be adjusted by a heat treatment.

For example, a heat treatment in a hydrogen atmosphere may be performed to relatively reduce the oxygen amount of the second portion 154 after forming of the second portion 154, while the heat treatment in the hydrogen atmosphere might not be performed after forming of the first portion 152 and the third portion 156. In some embodiments, the heat treatment in the hydrogen atmosphere may be performed after forming of the second portion 154, and the heat treatment in the hydrogen atmosphere may be performed after forming of the first portion 152 and/or the third portion 156. In this instance, the heat treatment performed after forming of the second portion 154 may have a larger hydrogen amount, a higher process temperature, or a longer process time than the heat treatment performed after forming of the first portion 152 and/or the third portion 156. Then, an oxygen amount of the second portion 154 may be smaller than an oxygen amount of the first portion 152 and/or the third portion 156. Accordingly, when the atomic layer deposition process is used, the composition (e.g., the oxygen amount) of the first portion 152, the second portion 154, and/or the third portion 156 may be easily adjusted.

An upper separation region 162 (refer to FIG. 1) may be formed by forming an opening for the upper separation region through an etching process using a mask layer and depositing an insulating material in the opening for the upper separation region. A manufacturing process, a manufacturing order, or the like of the upper separation region 162 may be modified in various manners. The upper separation region 162 may be formed before or after forming the channel structure CH.

Figure 5D:
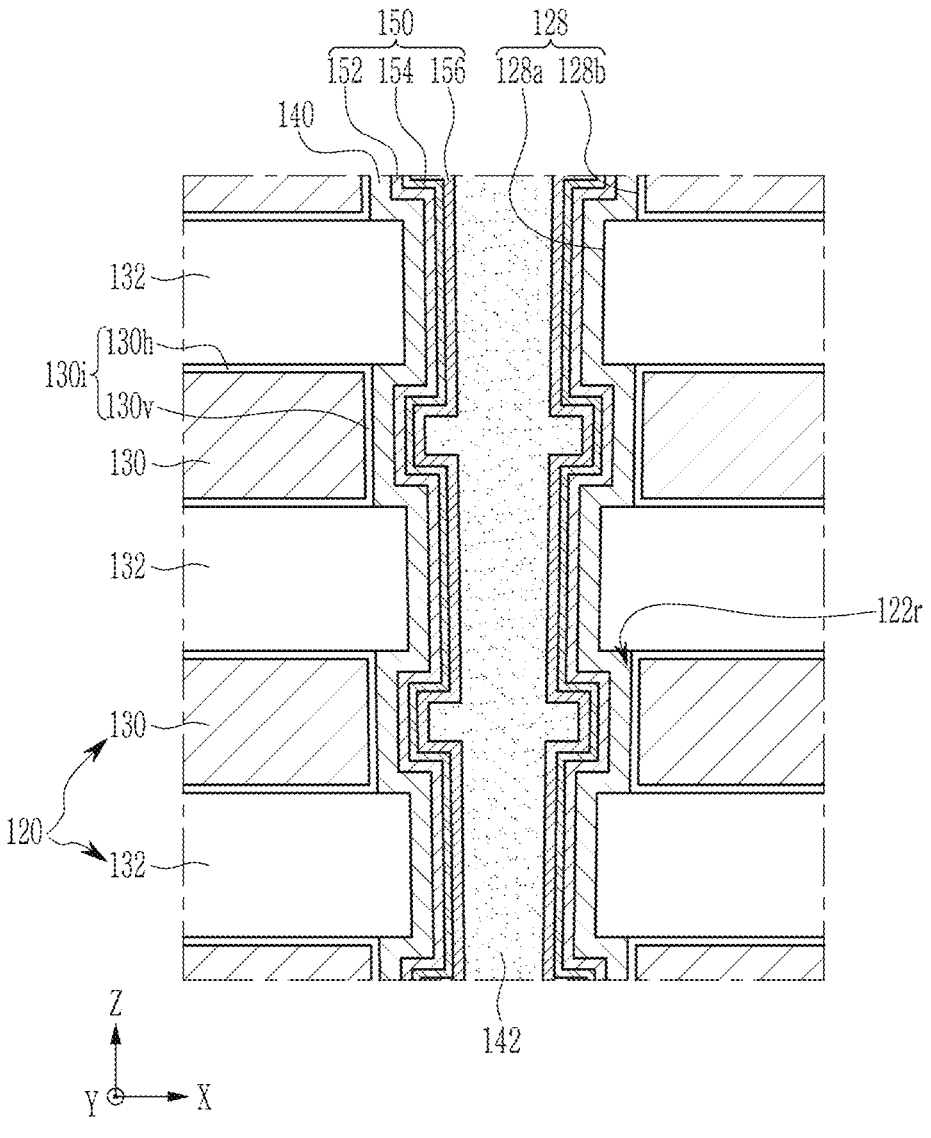

Subsequently, as illustrated in FIG. 5D, the sacrificial insulation layer 130s (refer to FIG. 5C) may be removed, and a gate insulation layer 130i and a gate electrode 130 may be formed in a region where the sacrificial insulation layer 130s was positioned. The gate insulation layer 130i and the gate electrode 130 may be formed using an atomic layer deposition process or a chemical vapor deposition process.

For example, an opening (not explicitly illustrated) may be formed to penetrate the stack structure 120s (refer to FIG. 5C) in which the sacrificial insulation layers 130s and the cell insulation layers 132 are stacked. The opening may be formed in a region corresponding to a separation structure 160 (refer to FIG. 1). By performing an etching process (e.g., a wet etching process) through the opening, the sacrificial insulation layer 130s may be selectively removed. Then, the gate insulation layer 130i and the gate electrode 130 may be formed by filling an insulating material constituting the gate insulation layer 130i and a conductive material constituting the gate electrode 130 in a portion where the sacrificial insulation layer 130s is removed. In this instance, the opening may be formed to expose the horizontal insulation layer 116. At least a part of the horizontal insulation layer 116 may be removed in an etching process through the opening, and a first horizontal conductive layer 112 may be formed by filling a material constituting the first horizontal conductive layer 112. Then, the separation structure 160 may be formed by filling the opening with an insulating material.

Thereafter, a first wiring portion 180 (refer to FIG. 1) connected to the channel structure CH or the like may be further formed.

In FIG. 5A to FIG. 5D, it is illustrated as an example that the manufacturing method using the stack structure 120s including the sacrificial insulation layer 130s and the cell insulation layer 132, but the embodiments are not limited thereto. After a gate stacking structure 120 is formed by stacking cell insulation layers 132 and gate electrodes 130, a penetration region 128 may be formed, and then a gate insulation layer 130i, a channel layer 140, a resistance variable layer 150, a core insulation layer 142, or the like may be formed in the penetration region 128.

According to an embodiment, a semiconductor device 10 having an enhanced performance and efficiency may be formed by a simple process.

Hereinafter, referring to FIG. 6 to FIG. 9, FIG. 10A to FIG. 10C, and FIG. 11, a memory device according to another embodiment and a manufacturing method of the same is described. To the extent that an element is not described in detail below, it may be understood that the element is at least similar to a corresponding element that has been described elsewhere within the present disclosure. A portion which is not described in the above will be described in detail.

Figure 6:
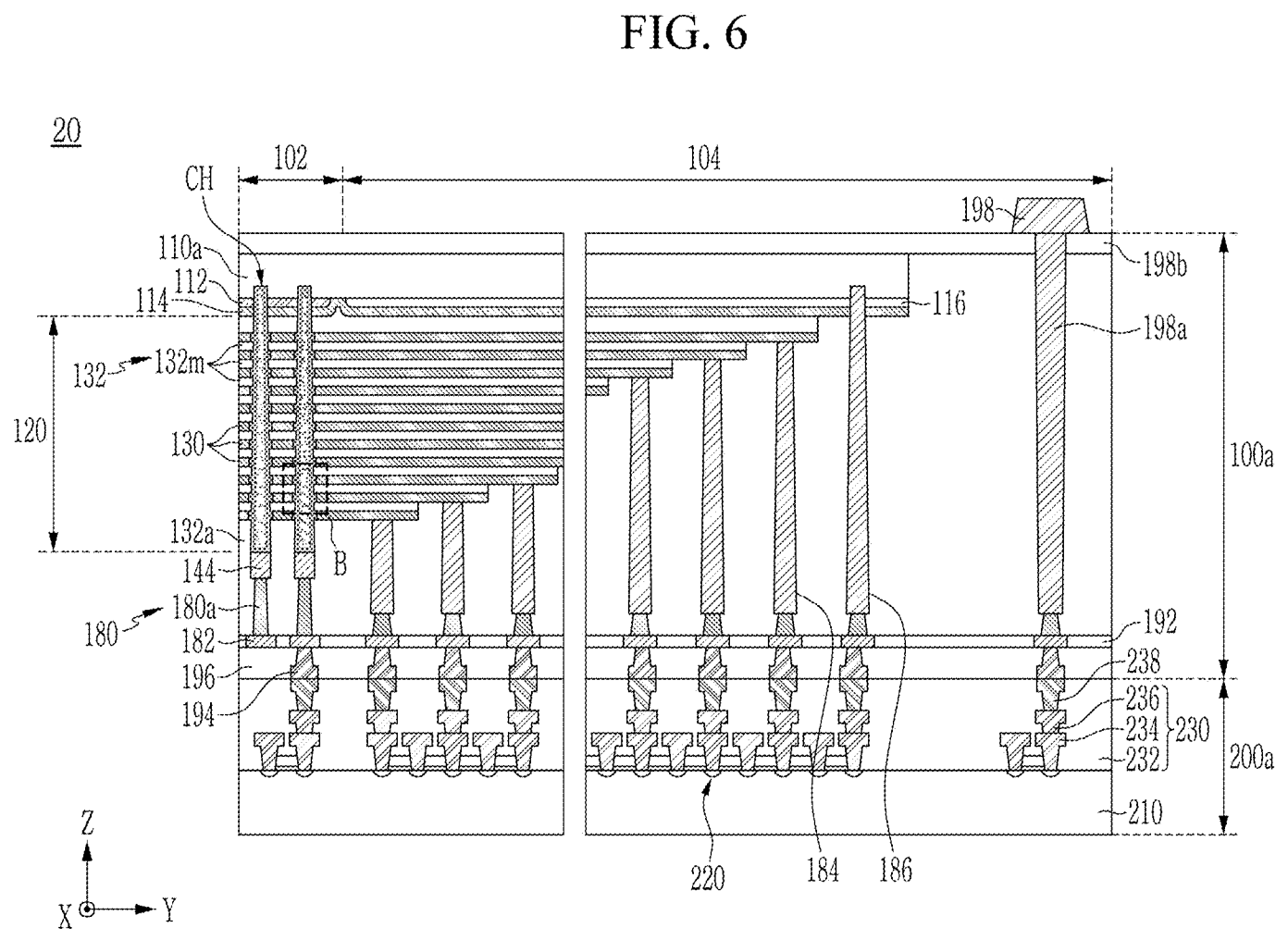
Figure 7:
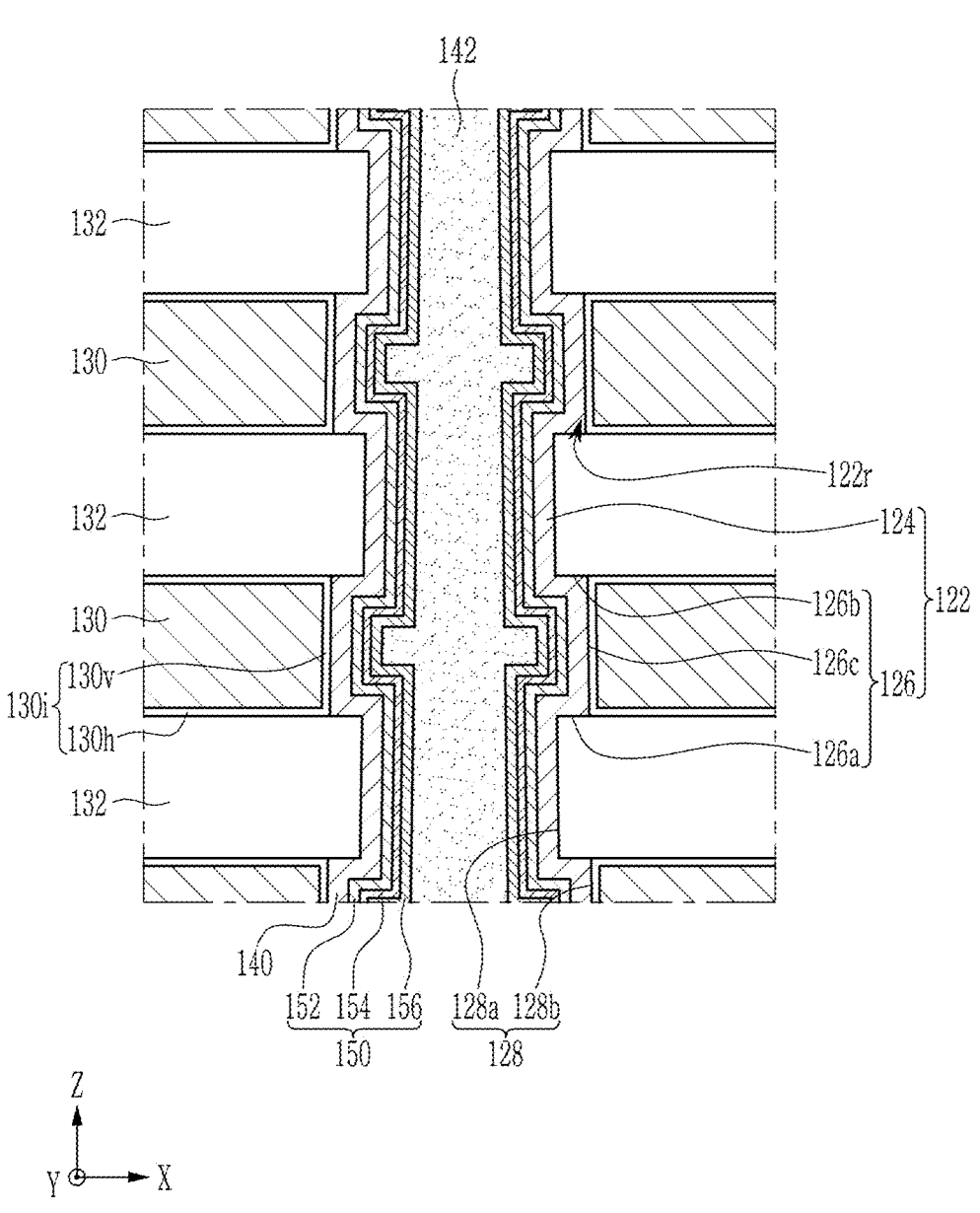
FIG. 7 is an enlarged partial cross-sectional view illustrating a portion B of FIG. 6.

FIG. 6 is a cross-sectional view schematically illustrating a semiconductor device according to an embodiment, and FIG. 7 is an enlarged partial cross-sectional view illustrating a portion B of FIG. 6.

Referring to FIG. 6 and FIG. 7, a semiconductor device 20 according to an embodiment may have a chip-to-chip (C2C) structure bonded by a wafer bonding type. That is, a lower chip including a circuit region 200a having a first substrate 210a may be manufactured, an upper chip including a cell region 100a having a second substrate 110a may be manufactured, and then a semiconductor device 20 may be manufactured by bonding the lower chip and the upper chip. In an embodiment, the semiconductor device 20 may be a memory device.

The circuit region 200a may include a first substrate 210, a circuit element 220, a first wire portion 230, and a first bonding structure 238 electrically connected to the first wire portion 230 at a surface facing the cell region 100a. A region other than the first bonding structure 238 at the surface facing the cell region 100a may be covered by a first insulation layer 232.

The cell region 100a may include a second substrate 110a, a gate stacking structure 120, a channel structure CH, a second wire portion 180, and a second bonding structure 194 electrically connected the second wire portion 180 at a surface facing the circuit region 200a. A region other than the second bonding structure 194 may be covered by an insulation layer 196.

In an embodiment, the second substrate 110a may be a semiconductor substrate including a semiconductor material. For example, the second substrate 110a may be a semiconductor substrate of a semiconductor material or may be a semiconductor substrate in which a semiconductor layer is on a base substrate. For example, the second substrate 110a may include or be formed of single-crystalline or polycrystalline silicon, germanium, silicon-germanium, silicon-on-insulator, germanium-on-insulator, or the like. In some embodiments, the second substrate 110a may be a supporting member including an insulation layer or an insulating material. This is because a semiconductor substrate provided in the cell region 100a may be removed after the cell region 100a is bonded to the circuit region 200a and the supporting member including the insulation layer or insulating material may be formed.

In the gate stacking structure 120, the gate electrode 130 may include a lower gate electrode, a memory cell gate electrode, and an upper gate electrode sequentially on the second substrate 110a from second substrate 110a toward the circuit region 200a. That is, as illustrated in FIG. 6 and FIG. 7, the gate stacking structure 120 may be sequentially stacked on a lower portion of the second substrate 110a in the drawings, and may have a structure in which the gate stacking structure 120 illustrated in FIG. 1 to FIG. 4 is disposed in a vertically inverted manner. The channel structure CH penetrating the gate stacking structure 120 and including the channel layer 140 and the resistance variable layer 150 sequentially stacked may have a structure in which the channel structure CH illustrated in FIGS. 1 to 4 is disposed in a vertically inverted manner. Accordingly, in a cross-sectional view, the channel structure CH may have an inclined side surface such that a width of the channel structure CH decreases as the channel structure CH goes from the circuit region 200a to the second substrate 110a. The channel pad 144 at an upper portion of the gate stacking structure 120 and the second wire portion 180 on the gate stacking structure 120 may be adjacent to the circuit region 200a.

For example, the first bonding structure 238 and/or the second bonding structure 194 may include aluminum, copper, tungsten, or an alloy including the same. For example, the first and second bonding structures 238 and 194 may include copper so that the cell region 100a and the circuit region 200a may be bonded (e.g., directly bonded) to each other by copper-to-copper bonding.

In FIG. 6, it is illustrated as an example that the gate stacking structure 120 includes one gate stacking structure. In some embodiments, the gate stacking structure may include a plurality of gate stacking structures as illustrated in FIG. 1. Unless otherwise described, the description of the gate stacking structure 120 and the channel structure CH with reference to FIG. 1 to FIG. 4, and FIG. 5A to FIG. 5D may be applied as it is. In FIG. 6, it is illustrated as an example that an electrical connection structure between the channel structure CH and horizontal conductive layers 112 and 114 and/or the second substrate 110 is the same as that illustrate in FIG. 1. The embodiments are not limited thereto, and the electrical connection structure between the channel structure CH and the horizontal conductive layers 112 and 114 and/or the second substrate 110 may be variously modified.

The semiconductor device 20 according to an embodiment may include an input/output pad 198 and an input/output connection wiring 198a electrically connected to the input/output pad 198. The input/output connection wiring 198a may be electrically connected to a part of the second bonding structure 194. For example, the input/output pad 198 may be on an insulation layer 198b covering an outer surface of the second substrate 110a. According to an embodiment, an additional input/output pad electrically connected to the circuit region 200a may be provided.

Figure 12:
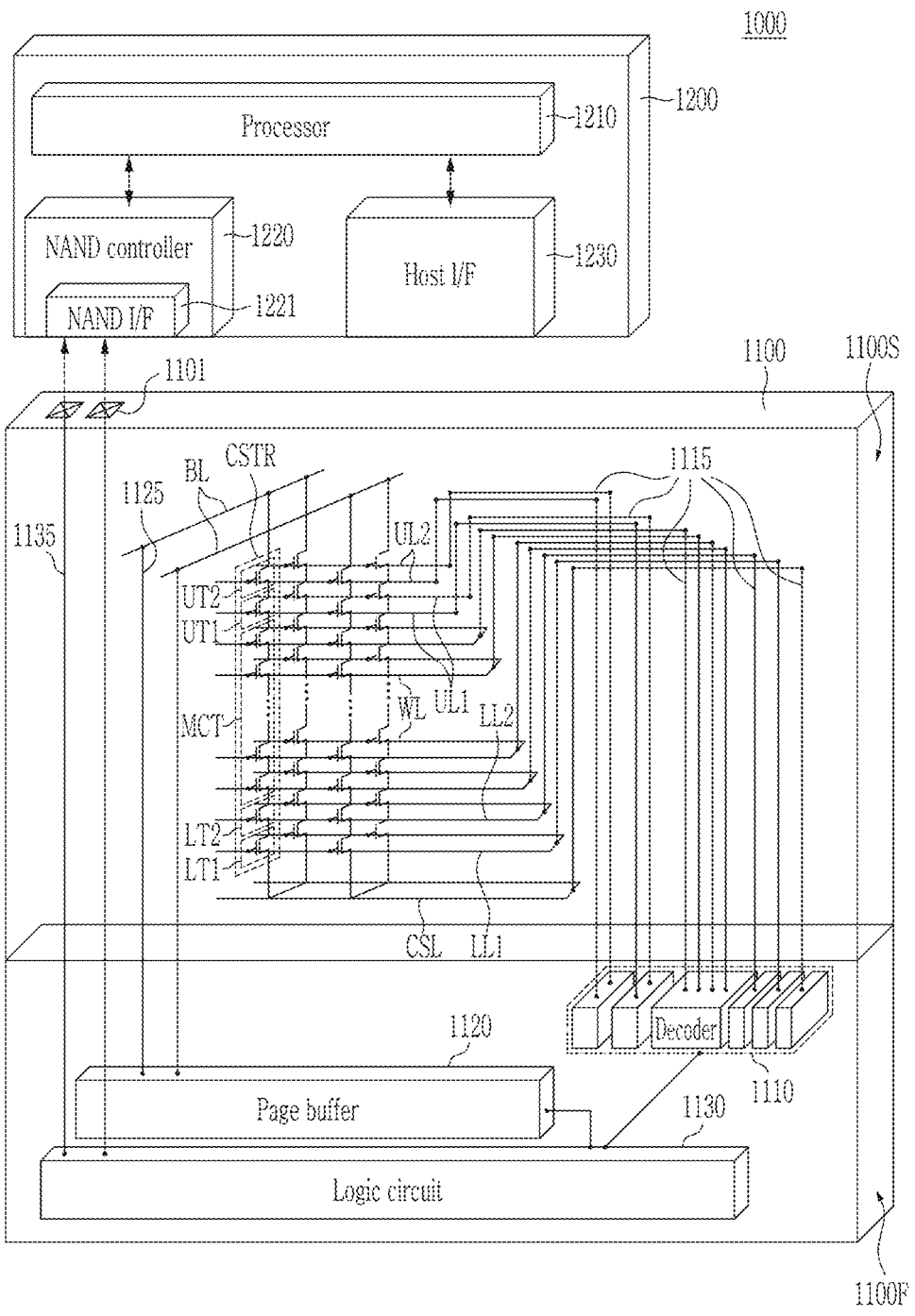
FIG. 12 is a view schematically illustrating an electronic system including a semiconductor device according to an embodiment.

For example, the circuit region 200a and the cell region 100a may be portions corresponding to a first structure 1100F and a second structure 1100S of a semiconductor device 1100 included in an electronic system 1000 illustrated in FIG. 12, respectively. In some embodiments, the circuit region 200a and the cell region 100a may be regions including a first structure 4100 and a second structure 4200 of a semiconductor chip 2200 illustrated in FIG. 15, respectively.

Figure 8:
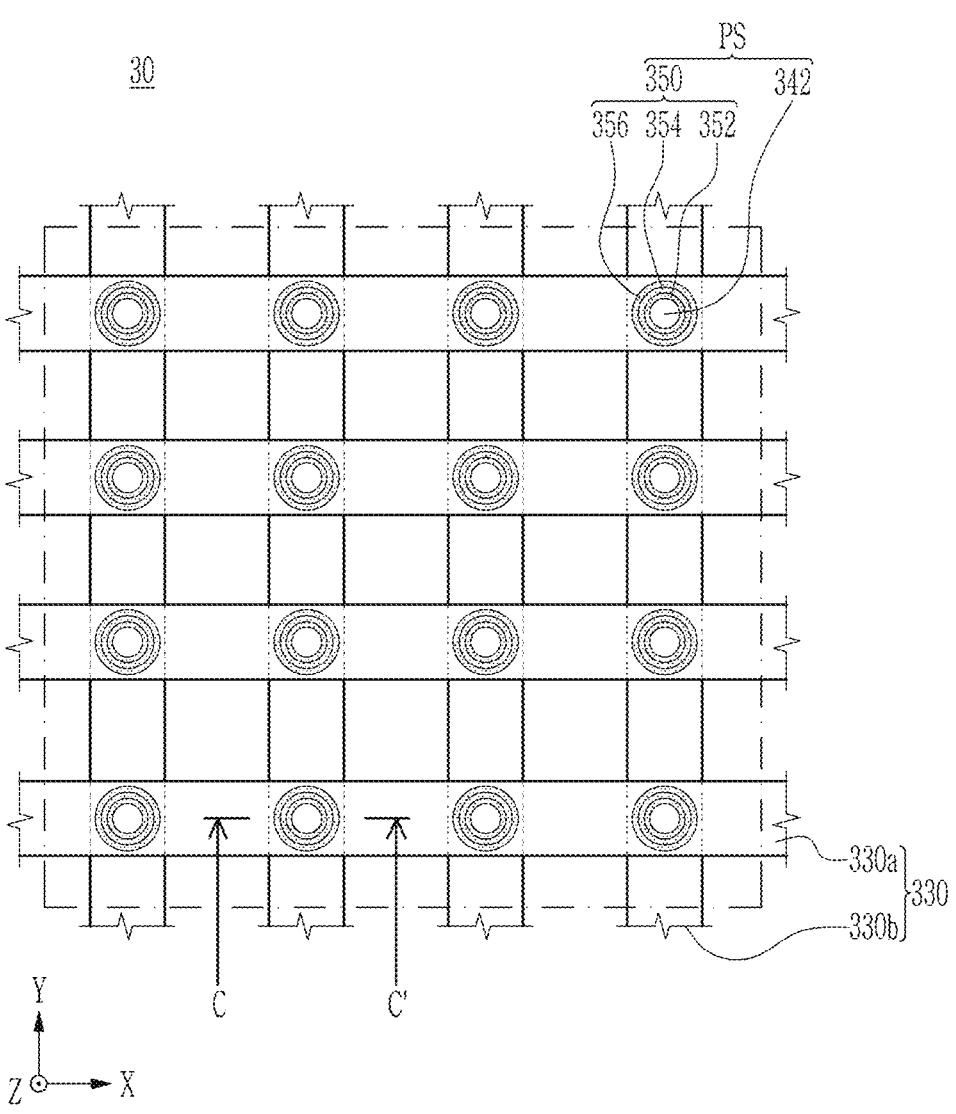
FIG. 8 is a plan view schematically illustrating a memory device according to an embodiment.
Figure 9:
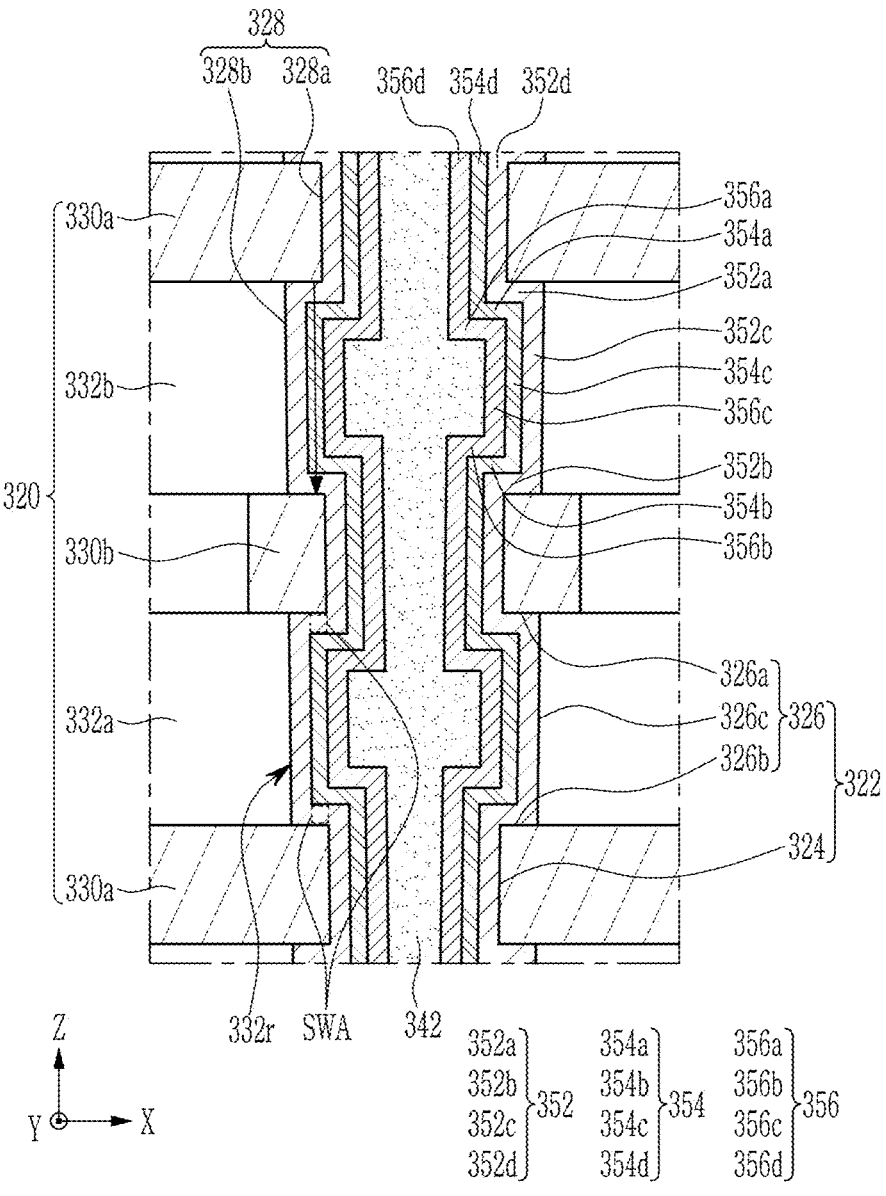
FIG. 9 is a cross-sectional view taken along a C-C' line of FIG. 8.

FIG. 8 is a plan view schematically illustrating a memory device according to an embodiment. FIG. 9 is a cross-sectional view taken along a C-C' line of FIG. 8. A stacking structure and a penetration structure in a cell region are mainly illustrated in FIG. 8 and FIG. 9. For simple illustration and a clear understanding, an interlayer insulation layer is omitted and a plurality of electrodes and a penetration structure are mainly illustrated in FIG. 9.

Referring to FIG. 8 and FIG. 9, a memory device 30 according to an embodiment may include a stacking structure 320 and a penetration structure PS. The stacking structure 320 may include a plurality of interlayer insulation layers 332a and 332b and a plurality of electrodes 330a and 330b alternately stacked. The penetration structure PS may include a portion extending in an extension direction (e.g., a vertical direction or a z-axis direction in the drawings) and penetrating the stacking structure 320. The penetration structure PS may include a resistance variable layer 350 at a side surface 322 of a stacking structure 320. More particularly, the stacking structure 320 may include a first electrode 330a, a first interlayer insulation layer 332a, a second electrode 330b, and a second interlayer insulation layer 332b sequentially stacked.

A plurality of first electrodes 330a may extend in a first direction (an X-axis direction in the drawings) and be spaced apart from each other at predetermined intervals in a second direction (a Y-axis direction in the drawings). The first interlayer insulation layer 332a may cover the plurality of first electrodes 330a. The plurality of second electrodes 330b on the first interlayer insulation layer 332a may extend in the second direction and be spaced apart from each other at predetermined intervals in the first direction. The second interlayer insulation layer 332b may cover the plurality of second electrodes 330b. A sequential stacked structure of the first electrode 330a, the first interlayer insulation layer 332a, the second electrode 330b, and the second interlayer insulation layer 332b is repeated in plural to constitute the stacking structure 320. Here, one of the first electrode 330a and the second electrode 330b may be a word line, and the other of the first electrode 330a and the second electrode 330b may be a bit line.

The first electrode 330a or the second electrode 330b may have any of various conductive materials. For example, the first electrode 330a or the second electrode 330b may include metal (e.g., tungsten, copper, aluminum, or the like), polysilicon, metal nitride (e.g., titanium nitride (TiN), tantalum nitride (TaN), or the like), or combination thereof. The first interlayer insulation layer 332a or the second interlayer insulation layer 332b may include any of various insulating materials. For example, the first interlayer insulation layer 332a or the second interlayer insulation layer 332b may include silicon oxide, silicon nitride, silicon oxynitride, a low dielectric constant material having a lower dielectric constant than silicon oxide, or a combination thereof. A material of the first electrode 330a, the second electrode 330b, the first interlayer insulation layer 332a, or the second interlayer insulation layer 332b may be variously modified, but the embodiments are not limited thereto.

In an embodiment, a penetration region 328 may penetrate the stacking structure 320, and a penetration structure PS may be in the penetration region 328. More particularly, in a plan view, the penetration region 328 may in a crossing region where the first electrode 330a and the second electrode 330b cross each other. The penetration region 328 may include a penetration portion 328a and a protrusion portion 328b. The penetration portion 328a may extend in an extension direction (e.g., a vertical direction or a Z-axis direction in the drawings) to penetrate the stacking structure 320. A plurality of protrusion portions 128b may protrude in a horizontal direction from the penetration portion 128a to correspond to the plurality of insulation layers 332a and 332b, respectively, between the first electrodes 330a and the second electrodes 330b. As a result, a recess portion 322r may be at a side surface of the stacking structure 320 adjacent to the penetration structure PS.

Each of the penetration structures PS constitutes one memory cell string, and the plurality of penetration structures PS may be spaced apart from each other while forming rows and columns in a plan view. For example, the plurality of penetration structures PS may be arranged in any of various forms such as a lattice form and a zigzag form in a plan view. The penetration structure PS may have a pillar shape. As an example, when viewed in a cross-sectional view, the penetration structure PS may have an inclined side surface such that a width of the penetration structure PS decreases as the penetration structure PS goes to a lower portion according to an aspect ratio. However, the embodiments are not limited thereto, and an arrangement, a structure, a shape, or the like of the penetration structure PS may be modified in various manners.

The penetration structure PS may include a resistance variable layer 350 on the side surface 322 of the stacking structure 320. The penetration structure PS may further include a core insulation layer 342 at an inside (e.g., a central region) of the resistance variable layer 350.

In an embodiment, the resistance variable layer 350 may be formed along the side surface 322 of the stacking structure 320 having the recess portion 322r, and may include a plurality of portions having different materials, compositions, or resistances. Unless otherwise described, the description of the resistance variable layer 150, and the first portion 152, the second portion 154 and the third portion 156 included in the resistance variable layer 150 in the embodiment with reference to FIG. 1 to FIG. 4 and FIG. 5A to FIG. 5D may be applied to the resistance variable layer 350, and a first portion 352, a second portion 354, and a third portion 356 included in the resistance variable layer 350, respectively, as it is. Unless otherwise described, the description of the core insulation layer 142 in the embodiment with reference to FIG. 1 to FIG. 4 and FIG. 5A to FIG. 5D may be applied to the core insulation layer 342 as it is.

In an embodiment, a plurality of recess portions 322r may be at the side surface 322 of the stacking structure 320 where the resistance variable layer 350 is positioned. The plurality of recess portions may correspond to a plurality of interlayer insulation layers 332 (i.e., the first interlayer insulation layer 332a and the second interlayer insulation layer 332b) between the first electrodes 330a and the second electrodes 330b. In this instance, side surfaces of the plurality of electrodes 330a and 330b may be base surfaces 324. The recess surface 326 may include a first recess surface 326a, a second recess surface 326b, and a third recess 326c. The first recess surface 326a may be a lower surface of the electrode 330a or 330b (e.g., the first electrode 330a or the second electrode 330b) at an upper portion of the recess portion 322r. The second recess surface 326b may be an upper surface of the electrode 330a or 330b (e.g., the second electrode 330b or the first electrode 330a) at a lower portion of the recess portion 322r. The third recess surface 326c may be a side surface of the interlayer insulation layer 332a or 332b and connect the first recess surface 326a and the second recess surface 326b.

In this instance, the third recess surface 326c or the side surfaces of the plurality of interlayer insulation layers 332a and 332b may be disposed at an inner side in comparison to the plurality of base surfaces 324 or side surfaces of the plurality of electrodes 330a and 330b. In some embodiments, the plurality of base surfaces 324 or the side surfaces of the plurality of electrodes 330a and 330b may protrude beyond (e.g., in the X-axis direction) the third recess surface 326c or the side surfaces of the plurality of interlayer insulation layers 332a and 332b.

In an embodiment, the resistance variable layer 350 may be entirely and continuously formed on the side surface of the stacking structure 320 including the plurality of recess portions 322r. Accordingly, the resistance variable layer 350 may have a shape repeatedly extending in the extension direction and the horizontal direction.

For example, the resistance variable layer 350 may include a first portion 352 and a second portion 354. The first portion 352 may include first expanded portions 352a, 352b, and 352c formed along the recess surface 326 of the recess portion 322r. The second portion 354 may be on the first portion 352 and include second expanded portions 354a, 354b, and 354c formed along the recess surface 326 of the recess portion 322r. The resistance variable layer 350 may include a third portion 356 on the second portion 354.

For example, the first portion 352 may be formed along the base surface 324 and the recess surface 326. For example, the first portion 352 may include a plurality of first expanded portions 352a, 352b, and 352c formed along the recess surfaces 326 of the plurality of recess portions 322r, respectively, and a first connection portion 352d connecting the plurality of first expanded portions 352a, 352b, and 352c on the base surface 324. The first expanded portions 352a, 352b, and 352c may be respectively referred to as a first upper portion 352a, a first lower portion 352b, and a first extension portion 352c. The first upper portion 352a may extend in the horizontal direction on the first recess surface 326a. The first lower portion 352b may extend in the horizontal direction on the second recess surface 326b. The first extension portion 352c may connect the first upper portion 352a and the first lower portion 352b on the third recess surface 326c.

The second portion 354 may be formed along the base surface 324 and the recess surface 326 on the first portion 352. That is, the second portion 354 may include a plurality of second expanded portions 354a, 354b, and 354c formed along the recess surfaces 326 on the first expanded portions 352a, 352b and 352c at the plurality of recess portions 322r, respectively, and a second connection portion 354d connecting the plurality of second expanded portions 354a, 354b, and 354c on the first connection portion 352d on the base surface 324. The second expanded portions 354a, 354b, and 354c may be respectively referred to as a second upper portion 354a, a second lower portion 354b, and a second extension portion 354c. The second upper portion 354a may extend in the horizontal direction on the first upper portion 352a on the first recess surface 126a. The second lower portion 354b may extend in the horizontal direction on the first lower portion 352b on the second recess surface 326b. The second extension portion 354c may connect the second upper portion 354a and the second lower portion 354b on the first extension portion 352c on the third recess surface 326c. The second expanded portions 354a, 354b, and 354c may respectively contact the first expanded portions 352a, 352b, and 352c.

The third portion 356 may be formed along the base surface 324 and the recess surface 326 on the second portion 354. That is, the third portion 356 may include a plurality of third expanded portions 356a, 356b, and 356c formed along the recess surfaces 326 on the second expanded portions 354a, 354b, and 354c at the plurality of recess portions 322r, respectively, and a third connection portion 356d connecting the plurality of third expanded portions 356a, 356b, and 356c on the second connection portion 354d on the base surface 324. The third expanded portions 356a, 356b, and 356c may be respectively referred to as a third upper portion 356a, a third lower portion 356b, and a third extension portion 356c. The third upper portion 356a may extend in the horizontal direction on the second upper portion 354a on the first recess surface 326a. The third lower portion 356b may extend in the horizontal direction on the second lower portion 354b on the second recess surface 326b. The third extension portion 356c may connect the third upper portion 356a and the third lower portion 356b on the second extension portion 354c on the third recess surface 326c. The second expanded portions 354a, 354b, and 354c may respectively contact the third expanded portions 356a, 356b, and 356c.

However, the embodiments are not limited thereto. In some embodiments, in the recess portion 322r, the third portion 356 may entirely fill an inside space surrounded by the second expanded portions 354a, 354b, and 354c.

In a plan view, a portion of the first upper portion 352a and a portion of the first lower portion 352b that overlap an overlapping portion of the plurality of electrodes 330a and 330b and the second portion 354 may correspond to the memory switching regions SWA. For example, a width of the memory switching region SWA in the first upper portion 352a or the first lower portion 352b may be substantially the same as a thickness of the second portion 354 or a width of the overlapping portion of the plurality of electrodes 330a and 330b and the second portion 354. A thickness of the memory switching region SWA may be substantially the same as a thickness of the first portion 352.

As such, the memory switching region SWA of the resistance variable layer 350 may be a region limited by the thickness of the second portion 354 or the width of the overlapping portion of the plurality of electrodes 330a and 330b and the second portion 354, and the thickness of the first portion 352. Accordingly, a size of the memory switching region SWA may be effectively reduced. When the size of the memory switching region SWA is minimized as in the above, operating voltage may be reduced and an operating voltage distribution may be effectively reduced.

In an embodiment, in a plan view, the electrodes 330a and 330b may overlap the second portion 354. Particularly, the electrodes 330a and 330b may overlap the second extension portion 354c of the second portion 354. The portion of the first upper portion 352a and the portion of the first lower portion 352b between the plurality of electrodes 330a and 330b may constitute the memory switching regions SWA, and the current may flow through the second portion 354 between the portion of the first upper portion 352a and the portion of the first lower portion 352b. When the second portion 354 (e.g., the second extension portion 354c) overlaps the electrodes 330a and 330b in a plan view, the current path may be effectively reduced.

For example, one surface of the second extension portion 354c adjacent to the side surface 322 of the stacking structure 320 may be closer to the third recess surface 326c than the base surface 324 or the side surfaces of the electrodes 330a and 330b. For example, the other surface of the second extension portion 354c opposite to the side surface 322 of the stacking structure 320 may be on the same plane as the base surface 324 or the side surfaces of the electrodes 330a and 330b or may be closer to the base surface 324 or the side surfaces of the electrodes 330a and 330b. Accordingly, an operation region of the memory cell is at an outside of the recess portion 322r and thus the memory cell may be stably operated. However, the embodiments are not limited thereto, and the other surface of the second extension portion 354c may be far away from the recess surface 326c than the base surface 324 or the side surfaces of the electrodes 330a and 330b.

In some embodiments, a width of the recess portion 322r in a horizontal direction may be larger than a thickness of the first portion 352, and may be the same as or smaller than a thickness of the resistance variable layer 350.

According to the above, the electrodes 330a and 330b stably overlap the second extension portion 354c of the second portion 354 in a plan view, thereby reducing the current path. However, the embodiments are not limited thereto. In some embodiments, the width of the recess portion 322r in the horizontal direction may be larger than the thickness of the resistance variable layer 350. Other numerous variations are possible.

For example, the width of the recess portion 322*r* may be the same as or smaller than the thickness of the first or second electrode 330*a* or 330*b*, a thickness of the first or second interlayer insulation layer 332*a* or 332*b*, or a thickness of the recess portion 322*r*. Thereby, the operating voltage distribution of the memory cell may be effectively reduced. In some embodiments, the width of the recess portion 322*r* may be larger than the thickness of the first or second electrode 330*a* or 330*b*, the thickness of the first or second interlayer insulation layer 332*a* or 332*b*, or the thickness of the recess portion 322*r*. In the extension direction, the thickness of the recess portion 322*r* may be substantially the same as an interval between the first electrode 330*a* and the second electrode 330*b*. However, the embodiments are not limited thereto.

In an embodiment, the memory device 30 may be a cross-point type memory device. The first and second electrodes 330*a* and 330*b* correspond a plurality of electrodes, and first and second interlayer insulation layers 332*a* and 332*b* correspond the plurality of insulation layers, and the penetration structure PS including the resistance variable layer 350 is included. In this instance, the plurality of recess portions 322*r* may correspond to a portion of the first or second interlayer insulation layer 332*a* or 332*b* between the first electrode 330*a* and the second electrode 330*b*.

An example of a manufacturing method of the memory device 30 will be described in detail with reference to FIG. 10A to FIG. 10C. To the extent that an element is not described in detail below, it may be understood that the element is at least similar to a corresponding element that has been described elsewhere within the present disclosure. A portion which is not described in the above will be described in detail.

Figure 10A:
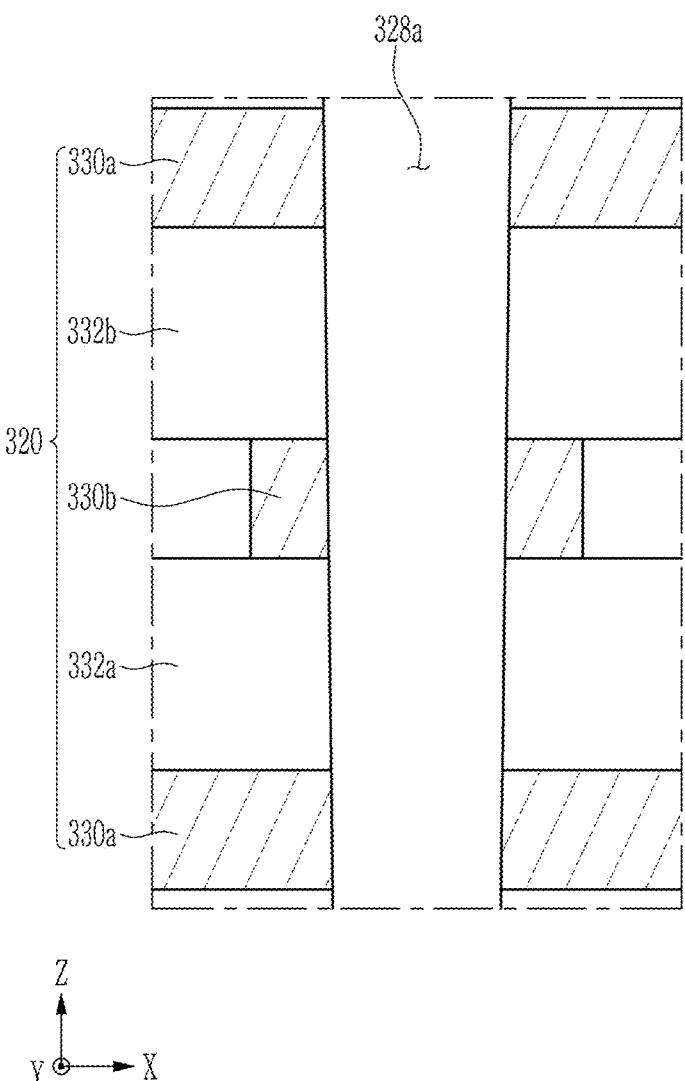
FIG. 10A to FIG. 10C are partial cross-sectional views illustrating a manufacturing method of a memory device according to an embodiment.
Figure 10B:
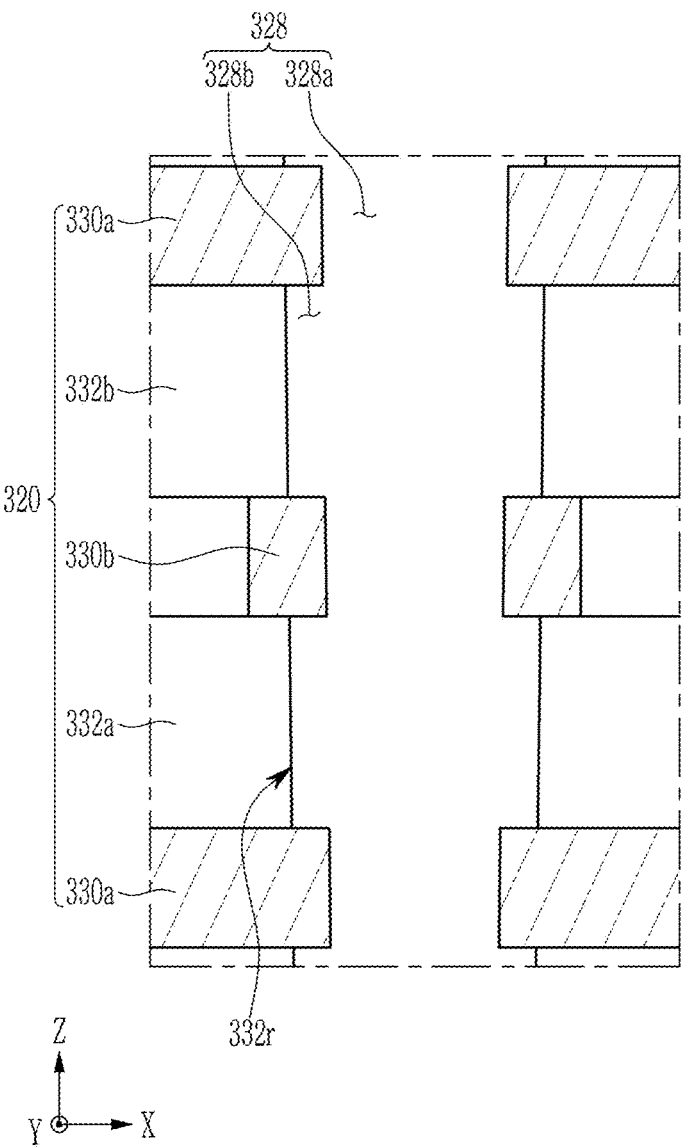
Figure 10C:
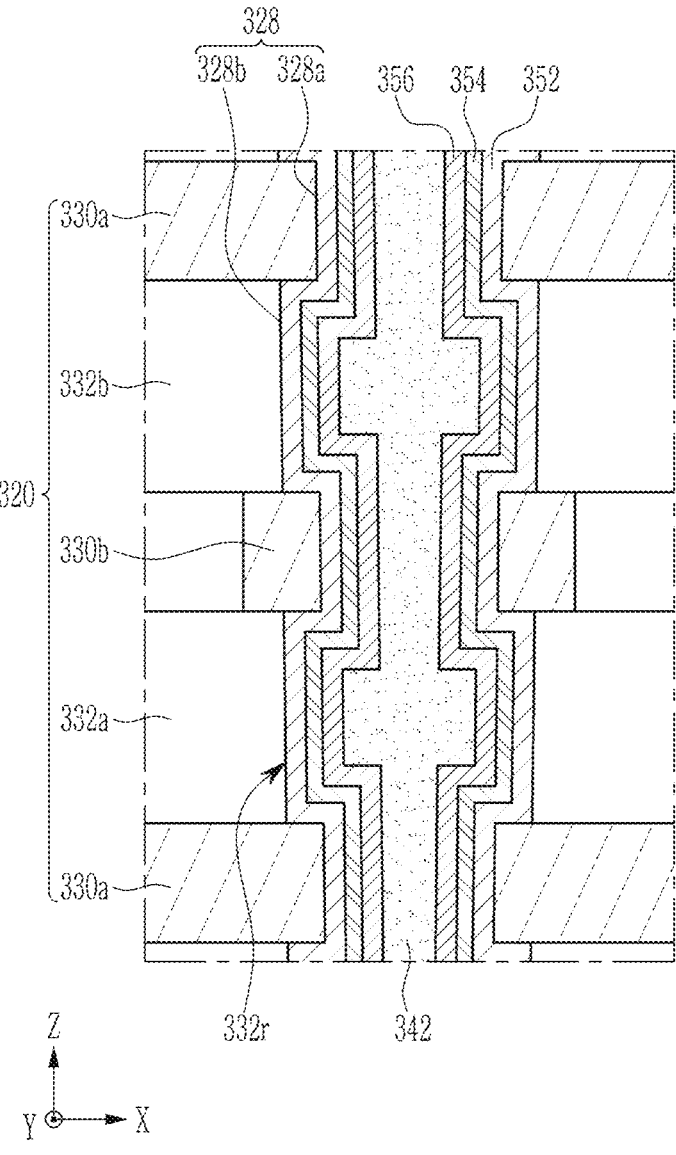

FIG. 10A to FIG. 10C are partial cross-sectional views illustrating a manufacturing method of a memory device 30 according to an embodiment. The portion illustrated in FIG. 9 is mainly illustrated in FIG. 10A to FIG. 10C. Hereinafter, a manufacturing method of a memory device 30 will be mainly described for a stacking structure 320 and a channel structure CH.

Referring to FIG. 10A, a stacking structure 320 may be formed by alternately stacking a first electrode 330*a*, a first interlayer insulation layer 332*a*, a second electrode 330*b*, and a second interlayer insulation layer 332*b*, and then, a penetration portion 328*a* of a penetration region 328 (refer to FIG. 10B) penetrating the stacking structure 320 may be formed. The penetration region 328 may be formed at a crossing region of the first electrode 330*a* and the second electrode 330*b*.

Subsequently, as illustrated in FIG. 10B, a protrusion portion 328*b* of the penetration region 328 may be formed by etching the interlayer insulation layers 332*a* and 332*b* between the first electrode 330*a* and the second electrode 330*b* in a horizontal direction. Accordingly, a part of each of the plurality of interlayer insulation layers 332*a* and 332*b* adjacent to the penetration portion 328*a* may be removed, such that recess portions 322*r* corresponding to the plurality of interlayer insulation layers 332*a* and 332*b*, respectively, may be formed.

Subsequently, as illustrated in FIG. 10C, a resistance variable layer 350 may be sequentially formed on a side surface of the penetration region 328 entirely and continuously in the penetration region 328. In this instance, the first portion 352, the second portion 354, and the third portion

356 may be sequentially formed. A core insulation layer 342 may be formed to form the penetration structure PS.

Unless otherwise described, the description of the manufacturing method with reference to FIG. 5A to FIG. 5D may be applied to the manufacturing method of the memory device 30.

Figure 11:
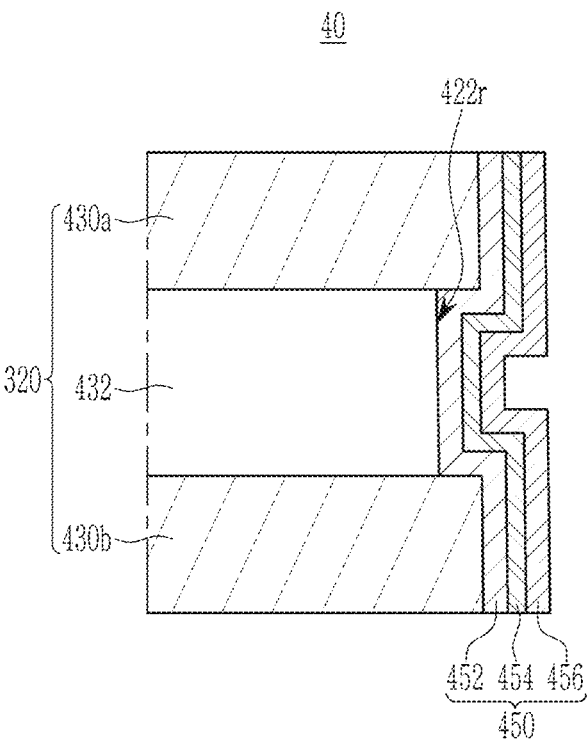
FIG. 11 is a cross-sectional view schematically illustrating a memory device according to an embodiment.

FIG. 11 is a cross-sectional view schematically illustrating a memory device according to an embodiment. A stacking structure and a resistance variable layer in a cell region are mainly illustrated in FIG. 11.

Referring to FIG. 11, a memory device 40 according to an embodiment may include a stacking structure 420. The stacking structure 420 may include a first electrode 430*a* and a second electrode 430*b*, and an interlayer insulation layer 432 between the first electrode 430*a* and the second electrode 430*b*. A resistance variable layer 450 may be on a side surface of the stacking structure 420. For example, the memory device 40 according to the embodiment may be used for an embedded memory or a back-end type.

A recess portion 422*r* may be provided at least at one side surface of the interlayer insulation layer 432 between the first electrode 430*a* and the second electrode 430*b*. The resistance variable layer 450 may be on the side surface of the stacking structure 420 having the recess portion 422*r*. In this instance, the resistance variable layer 450 may include a plurality of portions having different materials, compositions, or resistance. Unless otherwise described, the description with reference to FIG. 1 to FIG. 4, FIG. 5A to FIG. 5D, FIG. 6, and FIG. 7 may be applied to a material or the like of the resistance variable layer 450, and materials or the like of a first portion 452, a second portion 454, and a third portion 456 included in the resistance variable layer 450 as it is. Unless otherwise described, the description with reference to FIG. 8, FIG. 9, and FIG. 10A to FIG. 10C may be applied to a shape or the like the resistance variable layer 450, and shapes or the like of the first portion 452, the second portion 454, and the third portion 456 included in the resistance variable layer 450, the recess portion 422*r*, or the like as it is.

For example, a thickness of the first electrode 430*a* or the second electrode 420*b* may be 10 nm to 50 nm, and a thickness of the interlayer insulation layer 420 may be 5 nm to 30 nm. A width of the recess portion 422*r* in the horizontal direction may be 5 nm to 30 nm. However, this is an example, and the embodiments are not limited thereto.

In an embodiment, the memory device 40 may be a two-terminal type memory device or a two-electrode type memory device. The first and second electrodes 430*a* and 430*b* correspond to the plurality of electrodes, and the interlayer insulation layer 4320 corresponds to an insulation layer. In this instance, the recess portion 422*r* may be at least at one side surface of the interlayer insulation layer 432 between the first electrode 430*a* and the second electrode 430*b*.

A manufacturing method of the memory device 40 is as follows.

A stacking structure 420 may be formed by sequentially a first electrode 430*a*, an interlayer insulation layer 432, and a second electrode 430*b*. Accordingly, a part of the interlayer insulation layer 432 may be removed at least at one side surface of the interlayer insulation layer 432 between the first electrode 430*a* and the second electrode 430*b* to form the recess portion 422*r*. The resistance variable layer 450 may be formed on the side surface of the stacking structure 420 entirely and continuously. In this instance, the first portion 452, the second portion 454, and the third portion 456 may be sequentially formed. Unless otherwise described, the description of the manufacturing method with reference to FIG. 5A to FIG. 5D, and FIG. 10A to FIG. 10C may be applied to the manufacturing method of the memory device 40.

In FIG. 11, it is illustrated as an example that the recess portion 422r is at the side surface of the interlayer insulation layer 420 between the first electrode 430a and the second electrode 430b, and the resistance variable layer 450 is on the side surface of the stacking structure 420 having the recess portion 422r. However, the embodiments are not limited thereto. As illustrated in FIG. 9, a penetration structure penetrating a crossing region of a first electrode 430a and a second electrode 430b may be provided and the penetration structure may include the resistance variable layer 450 and/or a core insulation layer. That is, one first electrode 330a, one second electrode 330b adjacent to the one first electrode 330a, and the first or second interlayer insulation layer 332a or 332b between the one first electrode 330a and the one second electrode 330b in the embodiment with reference to FIG. 9 may constitute a two-terminal type memory device or a two-electrode type memory device. Other numerous variations are possible.

An example of an electronic system including the semiconductor device will be described in detail below.

FIG. 12 is a view schematically illustrating an electronic system including a semiconductor device according to an embodiment.

Referring to FIG. 12, an electronic system 1000 according to an embodiment may include a semiconductor device 1100 and a controller 1200 electrically connected to the semiconductor device 1100. The electronic system 1000 may be a storage device including one or a plurality of semiconductor devices 1100 or an electronic device including the storage device. For example, the electronic system 1000 may be a solid-state drive (SSD) device, a universal serial bus (USB), a computing system, a medical device, or a communication device including one or a plurality of semiconductor devices 1100.

The semiconductor device 1100 may be a non-volatile memory device, and for example, may be a NAND flash memory device described with reference to FIG. 1 to FIG. 4, FIG. 5A to FIG. 5D, FIG. 6, and FIG. 7. The semiconductor device 1100 may include a first structure 1100F and a second structure 1100S on the first structure 1100F. In some embodiments, the first structure 1100F may be next to the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, a word line WL, first and second gate upper lines UL1 and UL2, first and second gate lower lines LL1 and LL2, and a memory cell string CSTR between the bit line BL and the common source line CSL.

In the second structure 1100S, each of memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. A number of lower transistors LT1 and LT2 and a number of upper transistors UT1 and UT2 may be variously modified according to an embodiment.

In an embodiment, the lower transistors LT1 and LT2 may include a ground selection transistor, and the upper transistors UT1 and UT2 may include a string selection transistor. The first and second gate lower lines LL1 and LL2 may be gate electrodes of the lower transistors LT1 and LT2, respectively. The word line WL may be a gate electrode of the memory cell transistor MCT, and the gate upper lines UL1 and UL2 may be gate electrodes of the upper transistors UT1 and UT2, respectively.

The common source line CSL, the first and second gate lower lines LL1 and LL2, the word line WL, and the first and second gate upper lines UL1 and UL2 may be electrically connected to the decoder circuit 1110 through a first connection wiring 1115 extending to the second structure 1100S within the first structure 1100F. The bit line BL may be electrically connected to the page buffer 1120 through a second connection wiring 1125 extending to the second structure 1100S within the first structure 1100F.

In the first structure 1100F, the decoder circuit 1110 and the page buffer 1120 may execute a control operation for at least one memory cell transistor selected from the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S within the first structure 1100F.

The controller 1200 may include a processor 1210, a NAND controller 1220, and a host interface 1230. According to an embodiment, the electronic system 1000 may include the plurality of semiconductor devices 1100, and in this case, the controller 1200 may control the plurality of semiconductor devices 1100.

The processor 1210 may control an overall operation of the electronic system 1000 including the controller 1200. The processor 1210 may operate according to predetermined firmware, and may access the semiconductor device 1100 by controlling the NAND controller 1220. The NAND controller 1220 may include a NAND interface 1221 that processes communication with the semiconductor device 1100. A control command for controlling the semiconductor device 1100, data to be written in the memory cell transistor MCT of the semiconductor device 1100, and data to be read from the memory cell transistor MCT of the semiconductor device 1100, or the like may be transmitted through the NAND interface 1221. The host interface 1230 may provide a communication function between the electronic system 1000 and an external host. When a control command is received from the external host through the host interface 1230, the processor 1210 may control the semiconductor device 1100 in response to the control command.

Figure 13:
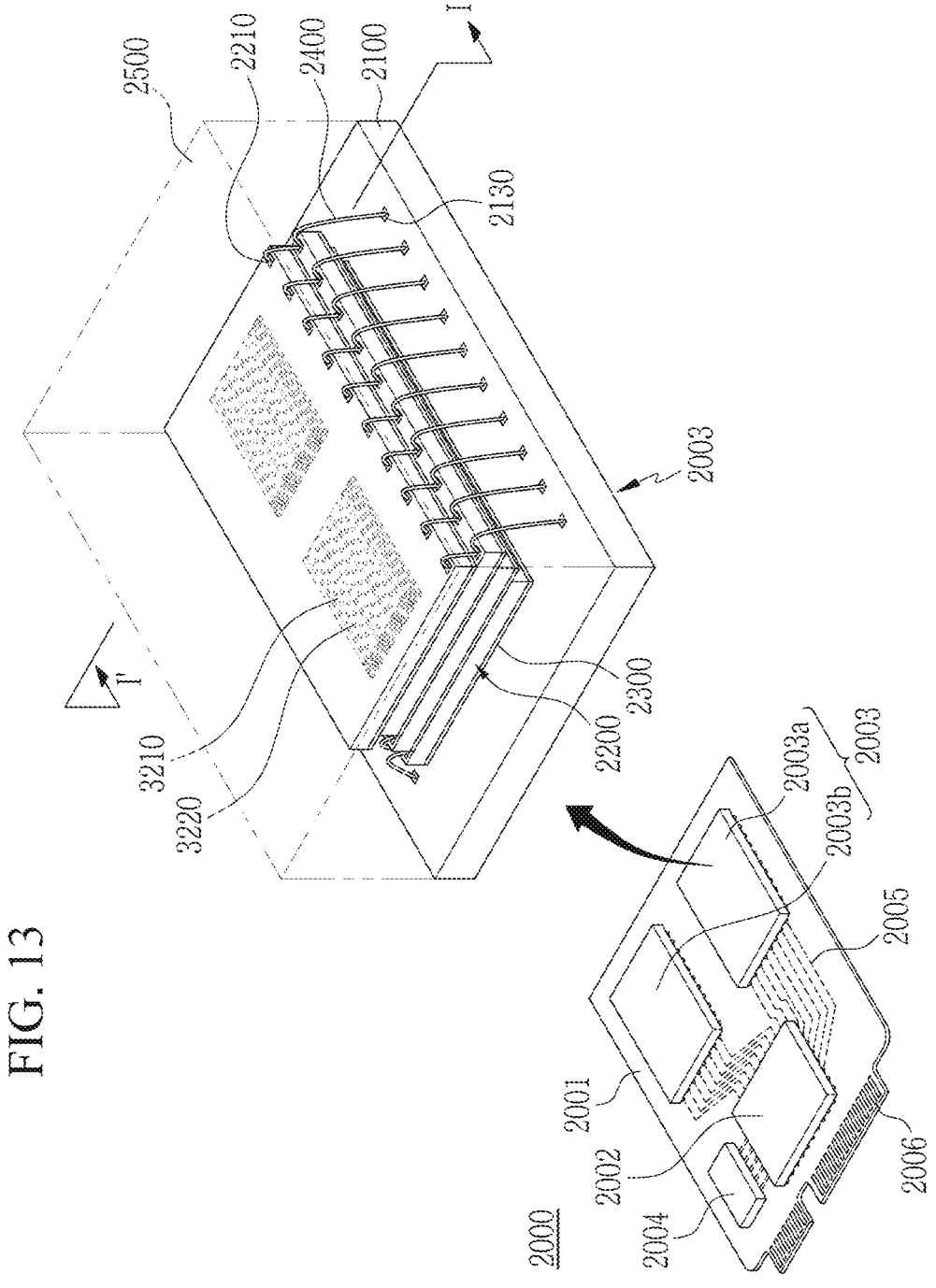
FIG. 13 is a perspective view schematically illustrating an electronic system including a semiconductor device according to an embodiment.

FIG. 13 is a perspective view schematically illustrating an electronic system including a semiconductor device according to an embodiment.

Referring to FIG. 13, an electronic system 2000 according to an embodiment may include a main substrate 2001, a controller 2002 on the main substrate 2001, one or more semiconductor packages 2003, and a DRAM 2004. The semiconductor package 2003 and the DRAM 2004 may be connected to the controller 2002 through a wiring pattern 2005 at the main substrate 2001.

The main substrate 2001 may include a connector 2006 including a plurality of pins coupled to an external host. A number and an arrangement of the plurality of pins in the connector 2006 may vary depending on a communication interface between the electronic system 2000 and the external host. In an embodiment, the electronic system 2000 may communicate with the external host according to any one of interfaces such as a universal serial bus (USB), a peripheral component interconnect express (PCI-Express), a serial advanced technology attachment (SATA), and an M-Phy for a universal flash storage (UFS). In an embodiment, the electronic system 2000 may operate by power supplied from the external host through the connector 2006. The electronic system 2000 may further include a power management integrated circuit (PMIC) that distributes the power supplied from the external host to the controller 2002 and the semiconductor package 2003.

The controller 2002 may write data in the semiconductor package 2003 or may read data from the semiconductor package 2003, and may improve an operating speed of the electronic system 2000.

The DRAM 2004 may be a buffer memory for mitigating or buffering a speed difference between the semiconductor package 2003, which is a data storage space, and the external host. The DRAM 2004 included in the electronic system 2000 may also be a kind of cache memory, and may also provide a space for temporarily storing data in a control operation for the semiconductor package 2003. When the electronic system 2000 includes the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be a semiconductor package including a plurality of semiconductor chips 2200. Each of the first and second semiconductor packages 2003a and 2003b may include a package substrate 2100, the semiconductor chip 2200 on the package substrate 2100, an adhesive layer 2300 at a lower surface of each semiconductor chip 2200, a connection structure 2400 electrically connecting the semiconductor chip 2200 and the package substrate 2100, and a molding layer 2500 covering the semiconductor chip 2200 and the connection structure 2400 on the package substrate 2100.

The package substrate 2100 may be a printed circuit board including a package upper pad 2130. Each semiconductor chip 2200 may include an input/output pad 2210. The input/output pad 2210 may correspond to the input/output pad 1101 of FIG. 12. Each semiconductor chip 2200 may include a gate stacking structure 3210 and a channel structure 3220. The semiconductor chip 2200 may include the semiconductor device described with reference to FIG. 1 to FIG. 4, FIG. 5A to FIG. 5D, FIG. 6, and FIG. 7.

In an embodiment, the connection structure 2400 may be a bonding wire electrically connecting the input/output pad 2210 and the package upper pad 2130. Accordingly, in each of the first and second semiconductor packages 2003a and 2003b, the semiconductor chips 2200 may be electrically connected to each other using a bonding wire type, and the semiconductor chip 2200 may be electrically connected to the package upper pad 2130 of the package substrate 2100. According to an embodiment, in each of the first and second semiconductor packages 2003a and 2003b, the semiconductor chips 2200 may be electrically connected to each other by a connection structure including a through silicon via (TSV) instead of the connection structure 2400 using the bonding wire type.

In an embodiment, the controller 2002 and the semiconductor chip 2200 may be included in one package. For example, the controller 2002 and the semiconductor chip 2200 may be mounted on a separate interposer substrate that is different from the main substrate 2001, and the controller

2002 and the semiconductor chip 2200 may be connected to each other by a wiring at the interposer substrate.

Figure 14:
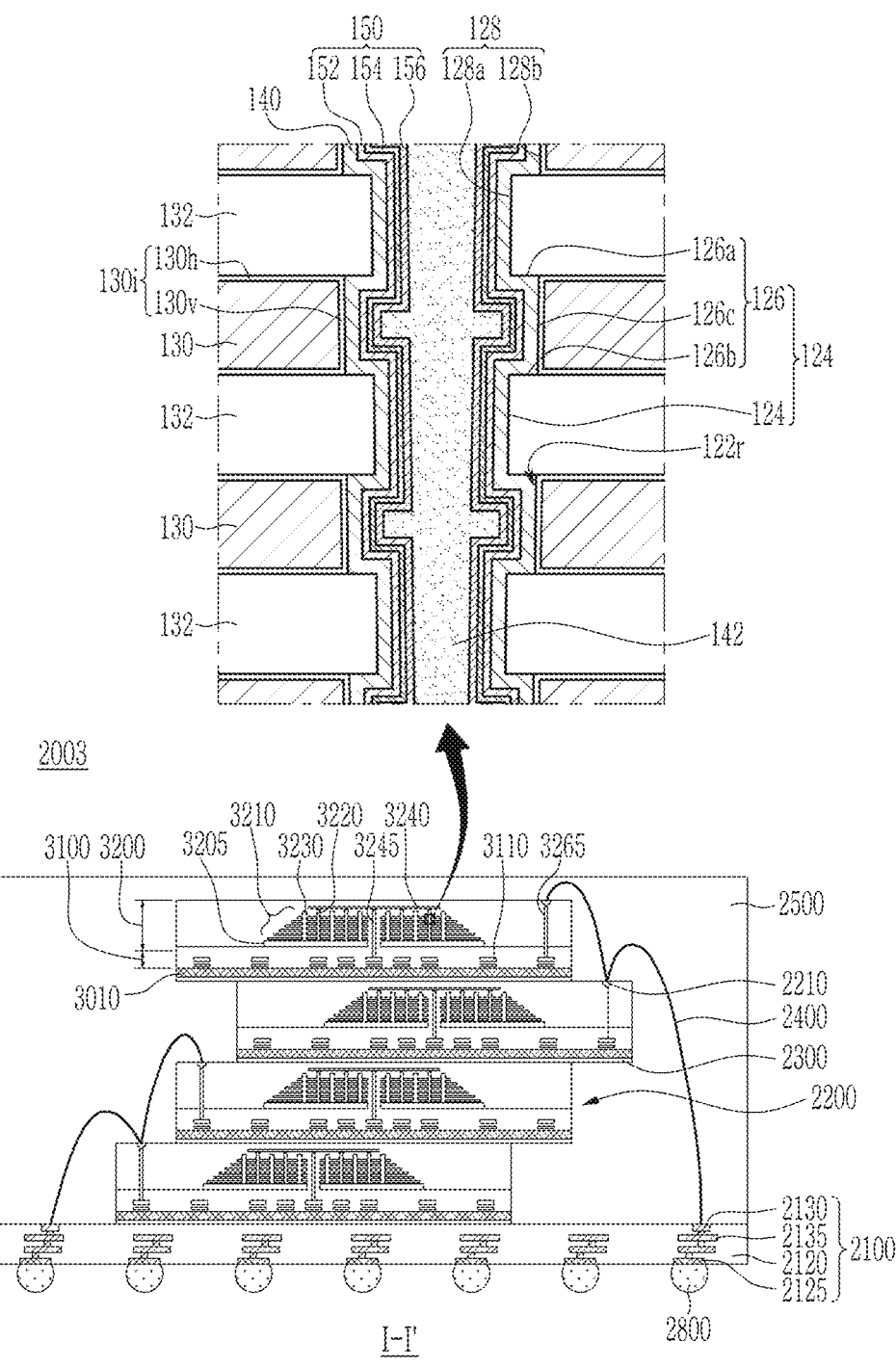
FIG. 14 is a cross-sectional view schematically illustrating a semiconductor package according to an embodiment.
Figure 15:
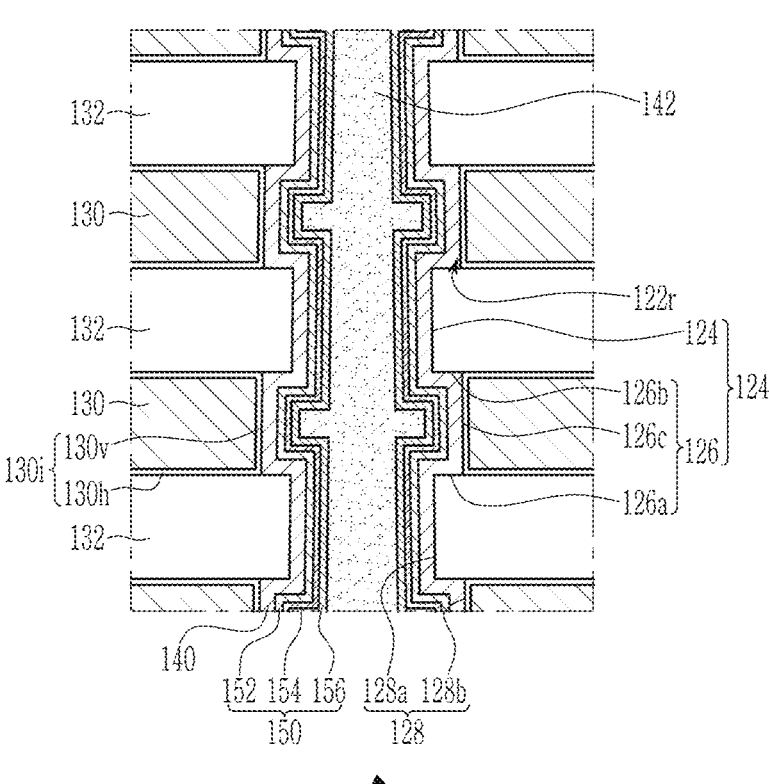
FIG. 15 is a cross-sectional view schematically illustrating a semiconductor package according to an embodiment.
Figure 15:
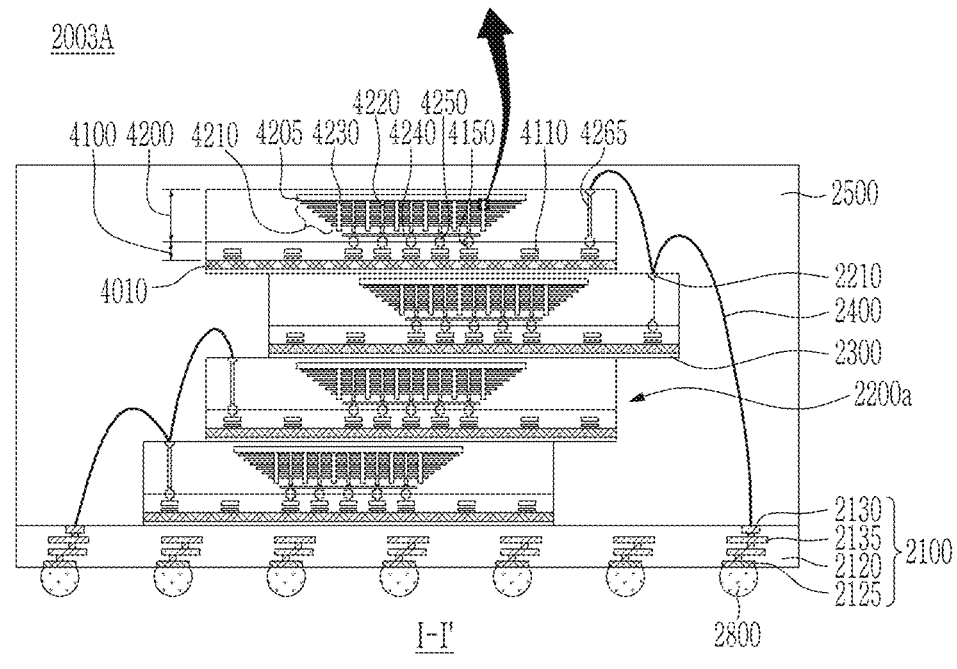

FIG. 14 and FIG. 15 are cross-sectional views schematically illustrating semiconductor packages according to embodiments, respectively. FIG. 14 and FIG. 15 respectively describe embodiments of the semiconductor package 2003 of FIG. 13, and conceptually illustrate a region obtained by cutting the semiconductor package 2003 of FIG. 13 along a line I-I'.

Referring to FIG. 14, in the semiconductor package 2003, the package substrate 2100 may be a printed circuit board. The package substrate 2100 may include a package substrate body portion 2120, a package upper pad 2130 at an upper surface of the package substrate body portion 2120, a package lower pad 2125 disposed at a lower surface of the package substrate body portion 2120 or exposed through the lower surface of the package substrate body portion 2120, and an internal wiring 2135 electrically connecting the package upper pad 2130 and the package lower pad 2125 inside the package substrate body portion 2120. The package upper pad 2130 may be electrically connected to the connection structure 2400. The package lower pad 2125 may be connected to a wiring pattern 2005 of the main substrate 2001 of the electronic system 2000, as illustrated in FIG. 13, through a conductive connection portion 2800.

The semiconductor chip 2200 may include a semiconductor substrate 3010, and a first structure 3100 and a second structure 3200 sequentially stacked on the semiconductor substrate 3010. The first structure 3100 may include a peripheral circuit region including a peripheral wiring 3110. The second structure 3200 may include a common source line 3205, a gate stacking structure 3210 on the common source line 3205, a channel structure 3220 and a separation structure 3230 penetrating the gate stacking structure 3210, a bit line 3240 electrically connected to the channel structure 3220, and a gate connection wiring electrically connected to a word line WL (refer to FIG. 12) of the gate stacking structure 3210.

In a semiconductor chip 2200, a semiconductor device, or a memory device according to an embodiment, operating voltage and an operating voltage distribution of a memory cell may be reduced by a recess portion and a resistance variable layer including a first portion and a second portion.

Each of the semiconductor chips 2200 may include a through wiring 3245 that is electrically connected to a peripheral wiring 3110 of the first structure 3100 and extends into the second structure 3200. The through wiring 3245 may penetrate the gate stacking structure 3210, and may be further provided at an outside of the gate stacking structure 3210. Each semiconductor chip 2200 may further include an input/output connection wiring 3265 electrically connected to the peripheral wiring 3110 of the first structure 3100 and extending into the second structure 3200, and an input/output pad 2210 electrically connected to the input/output connection wiring 3265.

In an embodiment, in the semiconductor package 2003, a plurality of semiconductor chips 2200 may be electrically connected to each other by a connection structure 2400 having a bonding wire type. In some embodiments, the plurality of semiconductor chips 2200 or a plurality of portions constituting the plurality of semiconductor chips 2200 may be electrically connected by a connection structure including a through silicon via (TSV).

Referring to FIG. 15, in a semiconductor package 2003A, each semiconductor chip 2200a may include a semiconductor substrate 4010, a first structure 4100 on the semiconductor substrate 4010, and a second structure 4200 disposed on the first structure 4100 and bonded to the first structure 4100 by a wafer bonding type.

The first structure 4100 may include a peripheral circuit region including a peripheral wiring 4110 and a first bonding structure 4150. The second structure 4200 may include a common source line 4205, a gate stacking structure 4210 between the common source line 4205 and the first structure 4100, a channel structure 4220 and a separation structure 4230 penetrating the gate stacking structure 4210, and a second bonding structure 4250 electrically connected to the channel structure 4220 and a word line WL (refer to FIG. 12) of the gate stacking structure 4210. For example, the second bonding structure 4250 may be electrically connected to the channel structure 4220 and the word line WL through a bit line 4240 electrically connected to the channel structure 4220 and a gate connection wiring electrically connected to the word line WL. The first bonding structure 4150 of the first structure 4100 and the second bonding structure 4250 of the second structure 4200 may be contact and bonded to each other. For example, a portion where the first bonding structure 4150 and the second bonding structure 4250 are bonded may include copper (Cu).

In a semiconductor chip 2200*a*, a semiconductor device, or a memory device according to an embodiment, operating voltage and an operating voltage distribution of a memory cell may be reduced by a recess portion and a resistance variable layer including a first portion and a second portion.

Each of the semiconductor chips 2200*a* may further include an input/output pad 2210 and an input/output connection wiring 4265 at a lower portion of the input/output pad 2210. The input/output connection wiring 4265 may be electrically connected to a part of the second bonding structure 4250.

In an embodiment, in the semiconductor package 2003A, a plurality of semiconductor chips 2200 may be electrically connected to each other by the connection structure 2400 having a bonding wire type. In some embodiments, the plurality of semiconductor chips 2200 or a plurality of portions constituting the plurality of semiconductor chips 2200 may be electrically connected by a connection structure including a through silicon via (TSV).

In the above description, it is illustrated as an example that the electronic system includes the semiconductor device described with reference to FIG. 1 to FIG. 4, FIG. 5A to FIG. 5D, FIG. 6, and FIG. 7, the embodiments are not limited thereto. The electronic system may include a memory device described with reference to FIG. 8, FIG. 9, FIG. 10A to FIG. 10C, or may include a memory device described with reference to FIG. 11. Other numerous modifications are possible.

While some examples have been described in connection with what is presently considered to be some practical embodiments, it is to be understood that the disclosure is not limited to the disclosed embodiments, and that the disclosure is intended to cover various modifications and equivalent arrangements included within the spirit and scope of the appended claims.

What is claimed is:

1. A memory device, comprising:
   a stacking structure including a plurality of electrodes and an insulation layer between the plurality of electrodes, the stacking structure having a recess portion corresponding to the plurality of electrodes or the insulation layer at a side surface of the stacking structure; and
   a resistance variable layer on the side surface of the stacking structure having the recess portion, the resistance variable layer including a portion extending in an extension direction crossing the stacking structure,
   wherein the resistance variable layer includes a first portion including a first expanded portion along a recess surface of the recess portion, a second portion including a second expanded portion along the recess surface of the recess portion on the first portion, and a third portion on the second portion, and
   wherein the second portion has a resistance smaller than a resistance of the first portion.

2. The memory device of claim 1, wherein an operating voltage of a material included in the second portion is smaller than an operating voltage of a material included in the first portion.

3. The memory device of claim 1, wherein the first portion and the second portion include the same oxide, and
   wherein an oxygen amount of the second portion is smaller than an oxygen amount of the first portion, the second portion includes more oxygen vacancy than the first portion, or the second portion has a non-stoichiometric composition in comparison to the first portion.

4. The memory device of claim 1, wherein the first portion or the second portion includes an oxide including at least one of vanadium (V), manganese (Mn), tin (Sn), titanium (Ti), zirconium (Zr), hafnium (Hf), tungsten (W), aluminum (Al), tantalum (Ta), zinc (Zn), nickel (Ni), rubidium (Rb), gadolinium (Gd), copper (Cu), molybdenum (Mo), and silicon (Si).

5. The memory device of claim 1, wherein the first portion and the second portion include zinc oxide,
   wherein the first portion has a chemical formula of $ZnOx$ (x is 0.8 to 1), and
   wherein the second portion has a chemical formula of $ZnOy$ (y is smaller than x and 0.5 to 0.8).

6. The memory device of claim 1, wherein a ratio of the resistance of the first portion to the resistance of the second portion is 100 or more.

7. The memory device of claim 1, wherein a thickness of the second portion is the same as or smaller than a thickness of the first portion.

8. The memory device of claim 1, wherein the second portion has a resistance smaller than a resistance of the third portion.

9. The memory device of claim 8, wherein the second portion and the third portion include the same oxide, and
   wherein an oxygen amount of the second portion is smaller than an oxygen amount of the third portion, the second portion includes more oxygen vacancy than the third portion, the second portion has a non-stoichiometric composition in comparison to the third portion, or the third portion has a density higher than a density of the second portion.

10. The memory device of claim 1, wherein the first expanded portion includes a first upper portion, a first lower portion, a first extension portion connecting the first upper portion and the first lower portion in the extension direction,
   wherein the second expanded portion includes a second upper portion on the first upper portion, a second lower portion on the first lower portion, and a second extension portion connecting the second upper portion and the second lower portion in the extension direction on the first extension portion, and
   wherein a part of the first upper portion and a part of the first lower portion are memory switching regions of the resistance variable layer.

11. The memory device of claim 1, wherein the insulation layer includes a plurality of insulation layers alternately stacked with the plurality of electrodes, wherein the memory device includes a channel structure including a portion extending in the extension direction, the channel structure including the resistance variable layer and a channel layer between the plurality of electrodes and the resistance variable layer, and wherein the recess portion at the side surface of the stacking structure adjacent to the channel structure includes a plurality of recess portions respectively corresponding to the plurality of electrodes between the plurality of insulation layers.

12. The memory device of claim 11, wherein the second expanded portion includes a second upper portion, a second lower portion, and a second extension portion connecting the second upper portion and the second lower portion in the extension direction, and wherein in a plan view, a plurality of extension portions of the channel layer on side surfaces of the plurality of insulation layers overlap the second extension portion of the second portion.

13. The memory device of claim 1, wherein the insulation layer includes a plurality of insulation layers alternately stacked with the plurality of electrodes, wherein the plurality of electrodes include a first electrode extending in a first direction and a second electrode extending in a second direction crossing the first direction, wherein the memory device includes a penetration structure including the resistance variable layer, the penetration structure including a portion extending in the extension direction at a crossing region of the first electrode and the second electrode, and wherein the recess portion at the side surface of the stacking structure adjacent to the penetration structure includes a plurality of recess portions respectively corresponding to the plurality of insulation layers between the plurality of electrodes.

14. The memory device of claim 13, wherein the second expanded portion includes a second upper portion, a second lower portion, and a second extension portion connecting the second upper portion and the second lower portion in the extension direction, and wherein in a plan view, the first electrode and the second electrode overlap the second extension portion of the second portion.

15. The memory device of claim 1, wherein the plurality of electrodes include a first electrode and a second electrode interposing the insulation layer therebetween, and wherein the recess portion is at least at a side surface of the insulation layer between the first electrode and the second electrode.

16. A memory device, comprising:

a stacking structure including a plurality of electrodes and an insulation layer between the plurality of electrodes, the stacking structure having a recess portion corresponding to the plurality of electrodes or the insulation layer at a side surface of the stacking structure; and a resistance variable layer on the side surface of the stacking structure having a recess portion, the resistance variable layer including a portion extending in an extension direction crossing the stacking structure, wherein the resistance variable layer includes an expanded portion along a recess surface of the recess portion, and wherein the expanded portion includes a plurality of portions having different materials, compositions, or resistances.

17. The memory device of claim 16, wherein the resistance variable layer includes a first portion including a first expanded portion along the recess surface of the recess portion, a second portion including a second expanded portion along the recess surface of the recess portion on the first portion, and a third portion on the second portion, and wherein the second portion has a resistance smaller than each of a resistance of the first portion and a resistance of the third portion.

18. The memory device of claim 17, wherein the first portion, the second portion, and the third portion include the same oxide, and wherein an oxygen amount of the second portion is smaller than each of an oxygen amount of the first portion and an oxygen amount of the third portion, the second portion includes more oxygen vacancy than each of the first portion and the third portion, or the second portion has a non-stoichiometric composition in comparison to each of the first portion and the third portion.

19. The memory device of claim 17, wherein the first portion, the second portion, and the third portion include zinc oxide, wherein the first portion has a chemical formula of $ZnO_x$ (x is 0.8 to 1), wherein the third portion has a chemical formula of $ZnO_z$ (z is 0.8 to 1), and wherein the second portion has a chemical formula of $ZnO_y$ (y is smaller than each of x and z, and 0.5 to 0.8).

20. An electronic system, comprising:

a main substrate;

a memory device on the main substrate; and a controller connected to the memory device on the main substrate, wherein the memory device includes:

a stacking structure including a plurality of electrodes and an insulation layer between the plurality of electrodes, the stacking structure having a recess portion corresponding to the plurality of electrodes or the insulation layer at a side surface of the stacking structure; and a resistance variable layer on the side surface of the stacking structure, the resistance variable layer including a portion extending in an extension direction crossing the stacking structure, wherein the resistance variable layer includes a first portion including a first expanded portion along a recess surface of the recess portion, a second portion including a second expanded portion along the recess surface of the recess portion on the first portion, and a third portion on the second portion, and wherein the second portion has a resistance smaller than a resistance of the first portion.

* * * * *